(12) United States Patent
Mori et al.

(10) Patent No.: US 6,642,994 B2
(45) Date of Patent: Nov. 4, 2003

(54) OPTICAL EXPOSURE APPARATUS AND PHOTO-CLEANING METHOD

(75) Inventors: Takashi Mori, Fujisawa (JP); Tetsuo Takahashi, Yokohama (JP); Hiroshi Nakamura, Kawasaki (JP); Yuji Kudo, Tokyo-to (JP); Taro Ogata, Tokyo (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 09/870,718

(22) Filed: Jun. 1, 2001

(65) Prior Publication Data

US 2001/0030740 A1 Oct. 18, 2001

Related U.S. Application Data

(60) Division of application No. 09/195,880, filed on Nov. 19, 1998, now Pat. No. 6,268,904, which is a continuation-in-part of application No. 09/064,355, filed on Apr. 22, 1998, now abandoned.

(30) Foreign Application Priority Data

| Apr. 23, 1997 | (JP) | 9-106487 |
| May 28, 1997 | (JP) | 9-155855 |
| May 28, 1997 | (JP) | 9-155856 |
| Dec. 4, 1997 | (JP) | 9-334470 |

(51) Int. Cl.$^7$ .................. G03B 27/42; G03B 27/54; G03B 27/32; A61N 5/00; G03C 5/00

(52) U.S. Cl. .............. 355/53; 355/67; 355/68; 355/69; 355/71; 355/77; 250/492.2; 430/30

(58) Field of Search ............. 355/53, 67, 68, 355/69, 71, 77; 250/492.2; 430/30

(56) References Cited

U.S. PATENT DOCUMENTS 3,594,080 A    7/1971  Jefferson (List continued on next page.)

FOREIGN PATENT DOCUMENTS

JP    A-6-322754    11/1994

*Primary Examiner*—Frank G. Font
*Assistant Examiner*—Khaled Brown
(74) *Attorney, Agent, or Firm*—Oliff & Berridge, PLC

(57) ABSTRACT

Optical exposure apparatus and methods of using same, for patterning a workpiece and photo-cleaning the optical components in the apparatus, which can be contaminated by moisture and organic compounds in the atmosphere. The apparatus comprises an illumination optical system having a light source and one or more optical components, and a projection lens having an object plane and an image plane and one or more optical components. The optical exposure apparatus includes an exposure optical path or an exposure light beam through a predetermined space in the optical exposure system. An optical path deflection member for deflecting light is introduced into the exposure optical path so as to create a second optical path that differs from the exposure optical path. Also disclosed is a method of photo-cleaning the aforementioned optical components, including the steps of forming an exposure optical path and then changing this path to create a second optical path that differs from the exposure optical path. An additional method of photo-cleaning a projection lens is disclosed, including the steps of providing an illumination light beam along an optical axis, providing and inserting a photo-cleaning optical member having refractive power into the beam, and refracting the beam so as to illuminate the lens surfaces comprising the projection lens.

42 Claims, 26 Drawing Sheets

U.S. PATENT DOCUMENTS

| | | |
|---|---|---|
| 4,871,237 A | 10/1989 | Anzai et al. |
| 5,028,967 A | 7/1991 | Yamada et al. |
| 5,309,198 A | 5/1994 | Nakagawa |
| 5,424,802 A | 6/1995 | Saita |
| 5,473,410 A | 12/1995 | Nishi |
| 5,602,683 A | 2/1997 | Straaijer et al. |
| 5,659,383 A | 8/1997 | Ozawa |
| 5,661,546 A | 8/1997 | Taniguchi |
| 5,696,623 A * | 12/1997 | Fujie et al. |
| 5,721,608 A | 2/1998 | Taniguchi |
| 5,815,248 A | 9/1998 | Nishi et al. |
| 5,912,727 A | 6/1999 | Kawai |
| 6,204,911 B1 * | 3/2001 | Kurosawa et al. |
| 6,262,792 B1 * | 7/2001 | Higashiki |

* cited by examiner

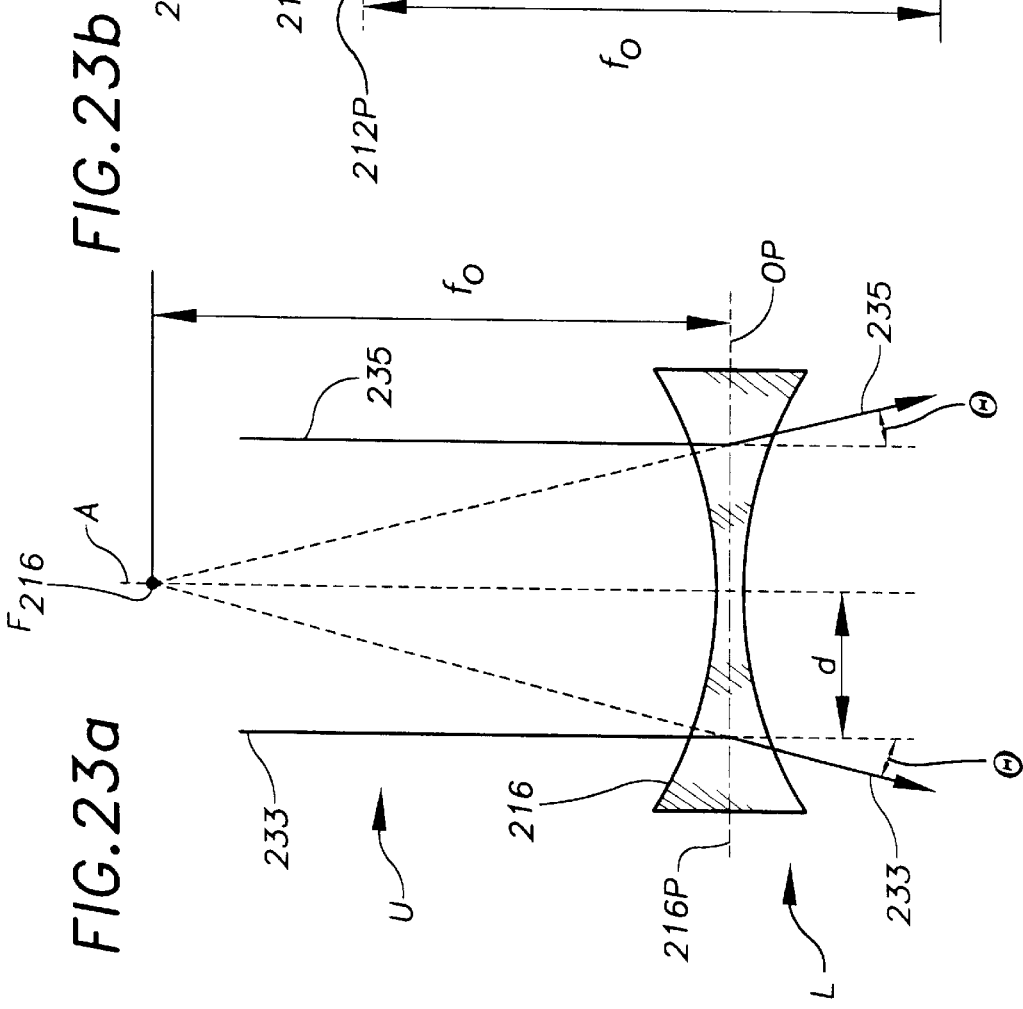

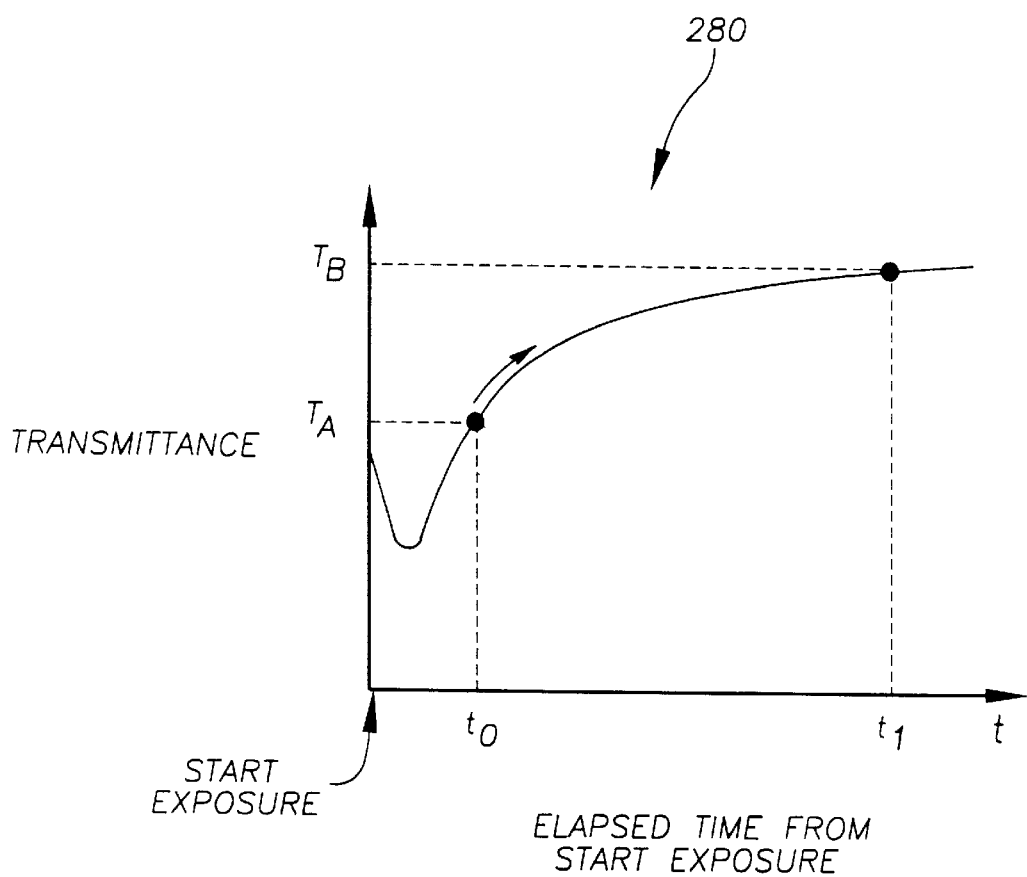

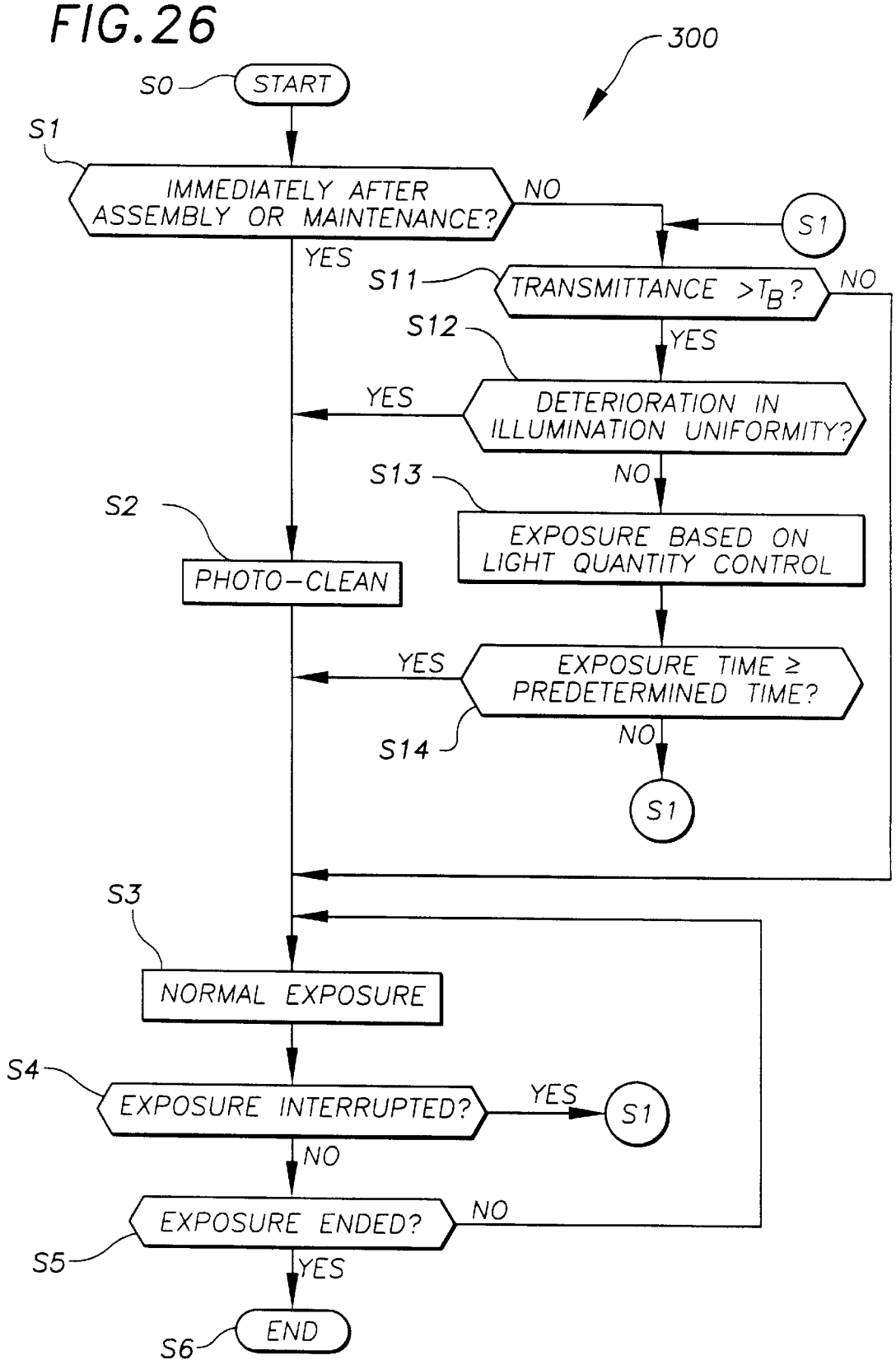

OPTICAL EXPOSURE APPARATUS AND PHOTO-CLEANING METHOD

This is a continuation-in-part of application Ser. No. 09/064,335, filed Apr. 22, 1998.

FIELD OF THE INVENTION

The present invention pertains to optical exposure apparatus and methods, and in particular to such apparatus and methods wherein the optical materials comprising the apparatus are susceptible to changes in their optical properties due to the presence of matter, such as moisture and organic compounds, in the atmosphere surrounding the apparatus.

BACKGROUND OF THE INVENTION

Present-day manufacturing of semiconductor devices, which includes integrated circuits, liquid crystal displays, thin film magnetic heads, and the like, employs optical exposure apparatus and methods. The increasing degree of integration of such semiconductor devices has placed increasing demands on the optical exposure apparatus to achieve higher levels of resolution. The resolution of an optical exposure apparatus can be approximated by the relation $$R = k \times \lambda / NA_P$$

wherein, R is the "resolution" or resolving power of the optical exposure apparatus (i.e., the size of the smallest feature that can be printed), $\lambda$ is the wavelength of the exposure light, $NA_P$ is the numerical aperture of the projection lens included therein, and k is a constant which depends upon on the type of recording medium used and the process for developing the images formed therein.

To keep up with the increasing degree of integration of semiconductor devices, continuing efforts are being made, as can be understood from the above formula, to increase the resolution of the optical exposure apparatus by shortening the wavelength of the exposure light and/or increasing $NA_P$. In recent years, KrF (krypton fluoride) excimer lasers having an output wavelength of 248 nm have been used for the exposure light source. Moreover, projection lenses $NA_P$ of 0.6 or greater have been commercialized, and features as small as 0.25 microns have been realized.

More recently, in an effort to increase resolution ArF (argon fluoride) excimer lasers having an output wavelength of 193 nm have been gaining attention as a successor light source to KrF excimer lasers. This reduction in wavelength could, in principle, allow the printing of features 0.18 microns or less. However, optical exposure apparatus operable at deep ultraviolet ("DUV", i.e., less than 200 nm) wavelengths are difficult to realize. One reason for this is that in this wavelength region, the materials available for the necessary optical components are currently limited to quartz and calcium fluoride (fluorite). For these materials to be suitable for use in DUV optical exposure apparatuses, they must have sufficient transmittance and internal uniformity (an internal transmittance of 0.995/cm or greater has been achieved with fused quartz, and negligible levels of absorption have been achieved with calcium fluorite). Also, optical components made from these materials require an anti-reflection coating on their surfaces when used at DUV wavelengths, to increase light transmission.

However, even with anti-reflection coatings and minimum levels of absorption, the optical characteristics of fused quartz and calcium fluorite can change due to the heat generated by surface contaminants, which absorb DUV light. Also, moisture and organic substances in the air easily adhere to the lens surfaces of lenses used in the optical exposure apparatuses discussed above. The lens surfaces can be contaminated by these contaminants during the manufacturing of the optical exposure apparatus, as well as during its maintenance. In particular, since these contaminants strongly absorb light having a wavelength of less than 200 nm, transmittance in optical exposure apparatus that use exposure light of less than 200 nm is reduced due to such contaminants adhering to the lens surfaces. For instance, it has been discovered that the transmittance of optical components made from fused quartz and calcium fluoride drops rapidly when exposed to moisture or organic compounds. The amount of this absorption, which can reach up to 0.01 per lens surface, is large compared to the absorption due to the material itself or the surface anti-reflection coatings. Therefore, it is necessary to keep the surfaces of fused quartz or calcium fluorite optical components free of such contaminants.

Japanese patent application Kokai No. Hei 7-294705 discloses a technique relating to a method for photo-cleaning individual optical components with light (hereinafter, "photocleaning"). In the photo-cleaning technique disclosed therein, the contaminants adhering to the lens surfaces, in the manner described above, separate from the lens surfaces when irradiated with ultraviolet light, effectively cleaning the lens surfaces. Further, when exposure light of less than 200 nm used in the optical exposure apparatus is ultraviolet light, the contaminants adhering to the lens surfaces may be photo-cleaned by operating the optical exposure apparatus and irradiating the lenses of the optical system with the exposure light. However, this technique does not disclose a method for photo-cleaning all, or the essential optical parts of, the optical components of an optical exposure apparatus after the apparatus has been assembled. It has been discovered by the present inventors that the temporary photo-cleaning of individual optical components by exposing them to DUV light actually facilitates the later absorption of ambient moisture and organic compounds onto the surfaces of the optical components. Consequently, even if individual optical components are photo-cleaned using DUV light, it is extremely difficult to assemble the optical components to form a projection exposure system, and then isolate those components completely from moisture, organic compounds, and other contaminants. This has been a major impediment in realizing a robust DUV projection exposure system.

Nevertheless, the numerical aperture $NA_I$ of illumination optical systems used in projection exposure apparatuses are generally smaller than $NA_P$ of projection lens. Consequently, only one part of the NA region of a projection lens (i.e., the region corresponding to $NA_I$) is illuminated if the illumination light from the illumination optical system impinges directly onto the projection lens. The result is that only the illuminated region is photo-cleaned. This is problematic because cleaned regions having high transmittance and contaminant-adhered regions having low transmittance arise on the lens surfaces, resulting in unevenness (i.e., non-uniformity) in the amount of light in the mask pattern image. This unevenness is due to transmittance unevenness and degradation of the resolving power caused by a reduction in the effective NA of the projection lens, which causes a drop in the imaging performance of the projection exposure apparatus. This has been another major impediment in realizing a robust DUV projection exposure system.

SUMMARY OF THE INVENTION

The present invention pertains to optical exposure apparatus and methods, and in particular to such apparatus and methods wherein the optical materials comprising the apparatus are susceptible to changes in their optical properties due to the presence of organic matter, such as moisture and organic compounds, in the atmosphere surrounding the apparatus.

More particularly, a first aspect of the invention is an optical exposure apparatus for forming an image on a photosensitive substrate. The apparatus comprises an illumination optical system having a light source and a light beam. Next to the illumination optical system is a reticle having a pattern. Next to the reticle on the opposite side of the illumination optical system is a projection lens. The projection lens and the illumination optical system have a predetermined space therein. An exposure optical path (i.e., the light path associated with performing an exposure) passes through this predetermined space. An optical path deflection member is removably arranged in the predetermined space so as to cause a deflection in the exposure optical path to form a second optical path. The second optical path differs from the exposure optical path. The second optical path is the light path associated with performing photo-cleaning. The optical path deflection member can be, for example, a rotating prism or one or more moving optical components (including lenses and mirrors).

In a second aspect of the invention, instead of an optical path deflection member, a light diffusing member is placed in the light beam associated with performing an exposure (i.e., the exposure light beam) so as to create a second light beam that is larger than the exposure light beam. This second light beam is the light beam associated with performing photo-cleaning.

In a third aspect of the invention, the optical path deflection member or light diffusing member is removably disposed within the predetermined space so that photo-cleaning can be performed between exposures.

A fourth aspect of the invention is a method of photo-cleaning an optical exposure apparatus for forming an image on a photosensitive substrate. The method comprises the steps of first, forming an exposure optical path in a predetermined space within an illumination optical system and a projection lens. The second step is preventing the photosensitive substrate from being in said exposure optical path. The third step is changing the exposure optical path to an optical path that differs from said exposure optical path.

A fifth aspect of the invention is a method of photo-cleaning a projection lens having an object plane. The method comprises a first step of providing an illumination light beam along an optical axis. The second step is providing and inserting a photo-cleaning optical member having refractive power into the illumination light beam. The third and last step is refracting the illumination light beam with the photo-cleaning optical member so as to illuminate lens surfaces of one or more lenses included in the projection lens.

A sixth aspect of the invention is an optical exposure apparatus capable of imaging a pattern present on a mask onto a photosensitive substrate. The apparatus comprises an illumination optical system with a light source for generating a light beam. A projection lens having an object plane is disposed adjacent the illumination optical system. A photo-cleaning optical member is removably provided between the illumination optical system and the projection lens and within the light beam so as to refract the light beam to impinge of the projection lens.

BRIEF DESCRIPTION OF THE DRAWINGS

FIGS. 23a and 23b are schematic diagrams indicating the focal length f for a photo-cleaning optical member comprising a negative lens and a positive lens, respectively;

FIG. 25 is a graph representing a time-varying characteristic of the transmittance of a projection lens;

FIG. 26 is a flowchart of the overall exposure and photo-cleaning procedure of the present invention.

DETAILED DESCRIPTION OF THE INVENTION

The present invention pertains to optical exposure apparatuses and methods, and in particular to such apparatuses and methods wherein the optical materials comprising the apparatus are susceptible to changes in their optical properties due to the presence of matter, such as moisture and organic compounds, in the atmosphere surrounding the apparatus. Such apparatuses include, for example, DUV-wavelength optical exposure or projection exposure apparatuses for semiconductor manufacturing, which utilize optical components made from synthetic quartz and/or calcium fluoride.

Figure 1:
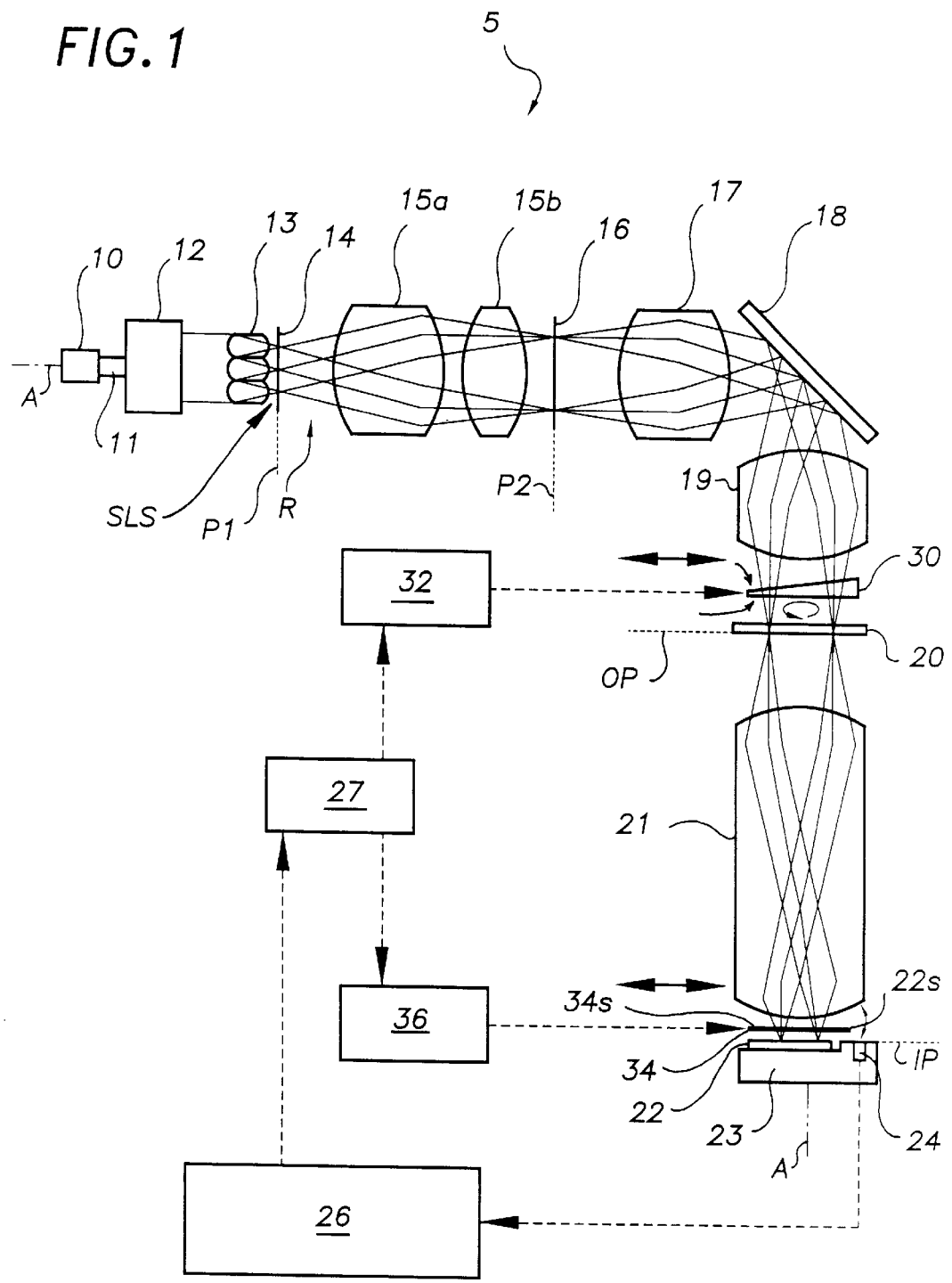
FIG. 1 is a schematic diagram of an embodiment of the optical exposure apparatus of the present invention, which includes a deflection prism and a single light detector located on the workpiece stage.

Referring to FIG. 1, optical exposure apparatus 5 includes, along an optical axis A, a light source 10 which emits a light beam 11. Light source 10 may be, for example, an ArF excimer laser emitting light at 193 nm. Adjacent light source 10 is a beam-shaping optical system 12, which adjusts the shape of light beam 11. An optical integrator 13 is located immediately adjacent optical system 12. Optical integrator 13 has a plurality of lens segments (three are shown) and can be, for example, a fly's-eye lens (i.e., a bundle of elongated optical elements, similar to that shown in FIG. 1), or an internal-reflection light pipe. Further, optical integrator 13 is not limited to being a single optical component, but may be a plurality of optical integrators arranged in series to achieve greater light beam uniformity.

Further included in optical exposure apparatus 5 adjacent optical integrator 13 is a first image plane P1 at which an aperture stop 14 is located. Adjacent aperture stop 14 is a front condensing lens 15a and a rear condensing lens 15b. Adjacent rear condensing lens 15b is a second image plane P2 at which an adjustable field stop 16 is located. Adjacent field stop 16 and second image plane P2 is a first objective lens 17, a fold mirror 18 and a second objective lens 19. The above-described optical components from front condensing lens 15a through second objective lens 19 constitute a condenser optical system. The above-described optical components from light source 10 to second objective lens 19 constitute an illumination optical system.

With continuing reference to FIG. 1, a reticle 20 is located optically conjugate to field stop 16, at the illumination optical system image plane (not shown) as defined by objective lenses 17 and 19. Reticle 20 contains small patterns (not shown) to be imaged. Adjacent reticle 20 is a projection lens 21 having an object plane OP and an image plane IP. Object plane OP of projection lens 21 is located optically conjugate to field stop 16, as defined by objective lens 17 and 19 (thus, reticle 20 is located at object plane OP). Projection lens 21 may be, for example, a dioptric or catadioptric high-performance DUV photolithographic lens comprising fused quartz and/or calcium fluoride optical components. Disposed at or near image plane IP of projection lens 21 is a workpiece 22 having a surface 22s. Workpiece 22 may be, for example, a wafer coated with a photosensitive recording medium, such as photoresist. Workpiece 22 is positioned and held in place by a movable workpiece stage 23. A light detector 24 is located on workpiece stage 23, and can be moved into the optical path underneath projection lens 21 to measure the intensity of the light passing therethrough. Light detector 24 is connected to a light detection system 26, which is connected to a control system 27. Here, light detection system 26 has the function for detecting light transmittance. Light detector 24 may be, for example, a photo-electric sensor, which converts light energy into an electrical signal.

With continuing reference to FIG. 1, optical exposure apparatus 5 further includes a rotatable deflection prism 30. Deflection prism 30 is inserted and removed from a predetermined space within optical exposure apparatus 5, which contains an optical path (i.e., light rays R) between second objective lens 19 and reticle 20, by a drive system 32 which is connected to control system 27. Also included in optical exposure apparatus 5 is a shutter 34. Shutter 34 is inserted and removed from the optical path (i.e., light rays R) between projection lens 21 and workpiece 22 by a drive system 36, which is also connected to control unit 27. When shutter 34 is inserted in the optical, the shutter is "closed," and when the shutter is removed from the optical, it is "open."

With continuing reference to FIG. 1, the operation of optical exposure apparatus 5 in exposing workpiece 22, in the absence of deflection prism 30 and shutter 34, is now described. First, light source 10, when activated, emanates light beam 11, which passes through beam-shaping optical system 12. Beam-shaping optical system 12 adjusts the shape (e.g., collimates and spatially filters) light beam 11 so that it has the appropriate dimensions prior to the light beam entering optical integrator 13. Optical integrator 13 then forms a plurality of images or secondary light sources SLS at image plane P1. Aperture stop 14, located at image plane P1, serves to limit the extent of light rays R emanating from secondary light sources SLS. Front and rear condensing lenses 15a and 15b then superimpose each light source of secondary light sources SLS to form a single, overlapping image (not shown) at image plane P2, as indicated by the path of light rays R. The image formed at image plane P2 has an intensity distribution that is highly uniform due to the superposition of the light sources of secondary light sources SLS.

Field stop 16, located at second image plane P2, serves to define the shape of the image formed at image plane P2. Light from the image formed at image plane P2 is relayed by first objective lens 17, fold mirror 18 and second objective lens 19 to object plane OP of projection lens 21 (coincident with the illumination optical system image plane, not shown), at or near which reticle 20 resides. Reticle 20 is thus uniformly illuminated, and an image of the pattern located thereon is projected onto surface 22a of workpiece 22 by projection lens 21. The optical path defined by light rays R (with or without reticle 20 present) is referred to herein as the exposure optical path. This is the optical path light from light source 10 follows through the predetermined space within the optical exposure apparatus when the optical exposure apparatus is arranged to perform an exposure to pattern the workpiece.

As mentioned above, for DUV optical exposure apparatus using fused quartz and/or calcium fluoride optical components, moisture and organic matter in the atmosphere surrounding the optical exposure apparatus tends to adhere to and contaminate the surfaces of the optical components. This changes the optical properties of the components, in particular reducing the transmittance of the refractive optical components and the reflectance of reflecting optical components. When light source 10 is a DUV light source and is activated (or alternatively, when aperture stop 14 or field stop 16 is opened) to perform an exposure of workpiece 22, the contaminated optical components are, to a certain extent, photo-cleaned by the DUV light passing therethrough. However, the present inventors have found that recontamination can quickly occur between exposures. Also, the photo-cleaning that does occur during exposure of the workpiece reduces the intensity of the exposure beam.

Accordingly, in the present invention, optical exposure apparatus 5 is configured so that, prior to exposing workpiece 22, a photo-cleaning process can be performed whereby light from light source 10 passes through each optical component in a manner that eliminates contamination from their respective surfaces. In this regard, the role of deflection prism 30 and shutter 34 is to provide light of sufficient intensity for photo-cleaning over the entire area desired for one or more optical components in optical exposure apparatus 5. Deflection prism 30 deflects light in the exposure optical (i.e., light rays R) entering projection lens 21, by a deflection angle Δ (not shown), which is a function of the prism wedge-angle α (not shown). Deflection prism 30 is rotatable by drive system 32 such that light rays R can be deflected to pass through portions, including the peripheral portions, of the optical components in projection lens 21 (i.e., the portions of the optical components other than those traversed by the exposure optical path).

To appreciate the importance of deflection prism 30 in performing photo-cleaning, it is useful to consider the photo-cleaning options available in optical exposure apparatus 5 of FIG. 1 without it. The first option is to perform photo-cleaning with reticle 20 removed. This would be preferred because the patterns on the reticle absorb light, reducing the intensity of the light passing through projection lens 21 resulting in less efficient photo-cleaning. However, the numerical aperture $NA_P$ of projection lens 21 is generally greater than numerical aperture $NA_I$ of the illumination optical system so that the projection lens can collect light diffracted from the pattern on reticle 20. This diffracted light is part of the exposure optical path and traverses certain peripheral portions of the optical components of projection lens 21. Accordingly, with reticle 20 removed, there is more light available for photo-cleaning, but the light will only traverse the optical components of projection lens 21 out to a radial distance defined by $NA_I$. The other option is to keep reticle 20 in place during photo-cleaning, so that certain peripheral portions of the optical components receive diffracted light. However, the diffracted light from typical reticle patterns does not have the necessary intensity for effective photo-cleaning.

In performing photo-cleaning using deflection prism 30, it is desirable to arrange deflection prism 30 such that deflection angle Δ satisfies the relationship $\Delta \geq NA_P - NA_I$. This ensures that the peripheral portions of the optical components (including those portions traversed and not traversed by the exposure optical path) will be photo-cleaned. Note that there is no need to reduce $NA_I$ during photo-cleaning, and it is generally preferable to set $NA_I$ at its maximum value.

With continuing reference to FIG. 1, insertion of shutter 34 into the optical path between projection lens 21 and workpiece 22 prevents exposure of workpiece 22 during photo-cleaning. Thus, replacement and/or aligning of the workpiece can be performed simultaneous with photo-cleaning. In a preferred embodiment, shutter 34 has a surface 34s facing projection lens 21 that is reflective. Thus, light rays R incident shutter surface 34s are reflected back through projection lens 21 and through the rest of optical exposure apparatus 5, thereby enhancing the photo-cleaning effect. Shutter 34 can also be tilted with respect to optical axis A passing therethrough, by means of drive system 36, thereby allowing for greater deflection of the light in the optical path, which increases the effectiveness of photo-cleaning.

The photo-cleaning process, as described above, can be performed with or without reticle 20 being present. However, when reticle 20 is present the time required for photo-cleaning increases due to light being absorbed by the reticle pattern. On the other hand, if reticle 20 is removed, the time required for photo-cleaning is shorter, but there is the added time is required for removing and inserting reticle 20. Accordingly, if the time needed for removing and inserting reticle 20 makes the overall photo-cleaning process longer, then it may be preferable to perform photo-cleaning with reticle 20 present.

Also, though deflection prism 30 is shown in FIG. 1 disposed between objective lens 19 and reticle 20, deflection prism 30 can be disposed anywhere in optical exposure apparatus 5. For example, it may be disposed between reticle 20 and projection lens 21, between aperture stop 14 and front condenser lens 15a, between field stop 16 and reticle 20, or within projection lens 21 itself. Generally speaking, deflection prism 30 should be disposed "upstream" (i.e., on the light-source 10 side) the optical component or components that require photo-cleaning.

With continuing reference to FIG. 1, light detector 24 located on workpiece stage 23, is used to measure the intensity of light passing through projection lens 21. This is accomplished by moving workpiece stage 23 in a direction parallel to image plane IP such that light detector 24 is inserted into the optical exposure path. When shutter 34 is opened, light is incident light detector 24, and the output (e.g., an electrical signal) therefrom is inputted and stored in light detection system 26. By comparing such light intensity measurements made at various points in time and stored in light detection system 26, the combined transmittance of the optical components in optical exposure apparatus 5 can be immediately determined and compared to an "optimum" transmittance corresponding to the "cleanest" state of optical exposure apparatus 5. Accordingly, a decision for whether or not to start the photo-cleaning process and whether or not to end the photo-cleaning process can be easily made. Alternatively, light detection system 26 can include an arbitrary threshold illumination intensity value, for deciding when photo-cleaning should commence.

Figure 2:
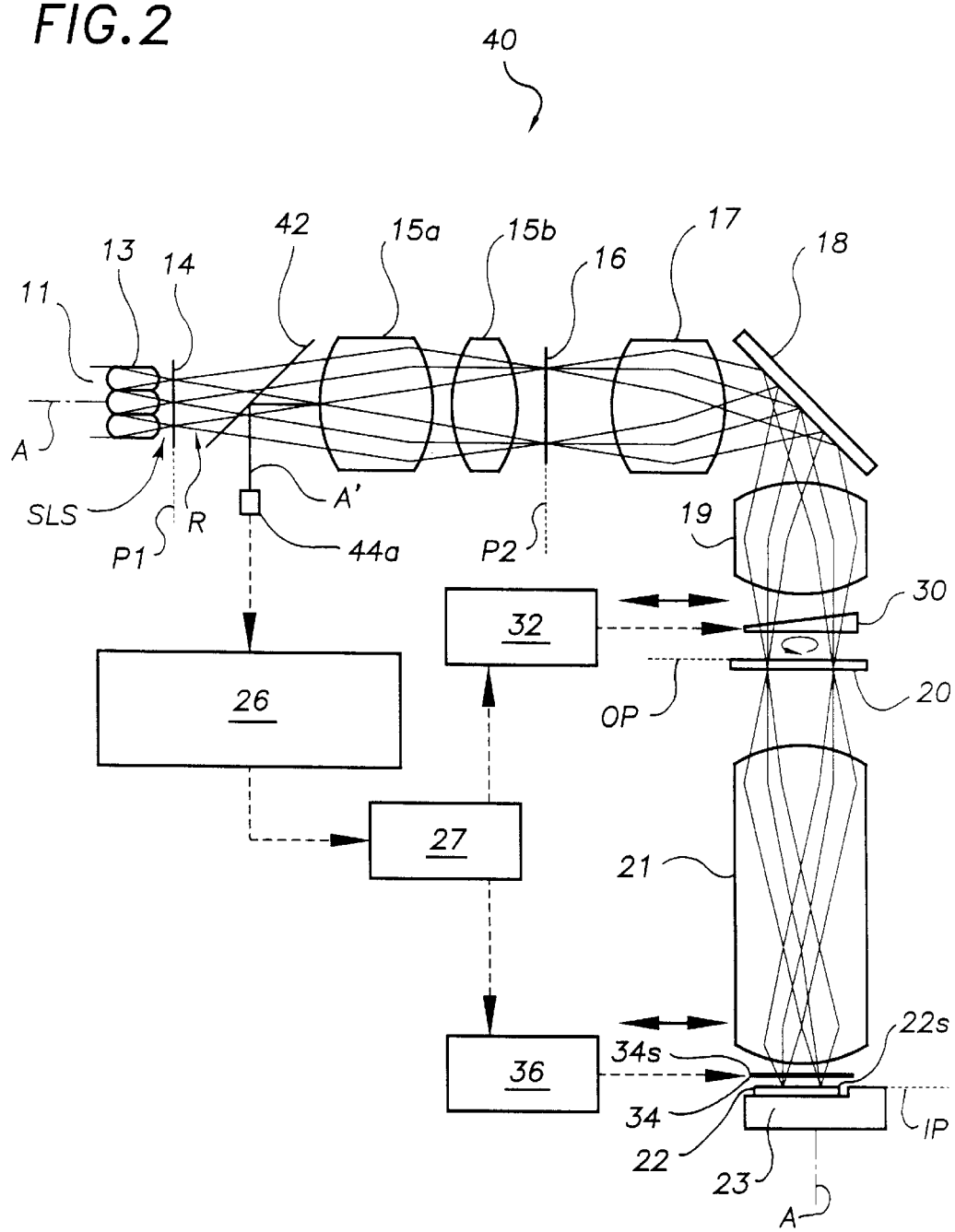
FIG. 2 is a schematic diagram of an embodiment of the optical exposure apparatus of the present invention, which includes a deflection prism, a beam splitter for creating a second optical path, and a single light detector located therein.

It may be desirable to measure the light intensity of optical exposure apparatus 5 of FIG. 1 at workpiece surface 22s when shutter 34 is closed. Thus, with reference now to FIG. 2, optical exposure apparatus 40 represents another preferred embodiment of the present invention which allows for this measurement. Optical exposure apparatus 40 includes the same elements as optical exposure apparatus 5 of FIG. 1, except that light detector 24 is removed. Optical exposure apparatus 40 further includes a beam splitter 42 disposed between aperture stop 14 and front condensing lens 15a, and a light detector 44a. Beam splitter 42 is disposed such that it creates an optical axis A' at right angles to optical axis A passing therethrough. Light detector 44a is disposed along optical axis A'.

In optical exposure apparatus 40, light reflected from reflective surface 34s of shutter 34 when shutter 34 is closed, and travels back up through the optical exposure apparatus and backwards through condensing lens 15a. A portion of this light is then reflected by beam splitter 42 along optical axis A' to light detector 44a. In this way, the light transmittance of optical exposure apparatus 40 during the photo-cleaning process can be measured in real-time, which is useful in deciding when the photo-cleaning process should terminate. Note that though beam splitter 42 is disposed between aperture stop 14 and front condensing lens 15a, it can be disposed anywhere in optical exposure apparatus 40, including anywhere in the illumination optical system or projection lens 21.

Certain optical exposure apparatuses include light sources whose light beam fluctuates in intensity. In such apparatuses, it is desirable to be able to distinguish between light beam intensity fluctuations due to the light source and fluctuations in the transmittance of the optical exposure apparatus due to contaminated optical components. Thus, with reference to FIG. 3, an optical exposure apparatus 50 represents a preferred embodiment of the present invention which can make such a distinction. Optical exposure apparatus 50 includes the same elements as optical exposure apparatus 5 of FIG. 1, except that a beam splitter 42 is added (as shown in optical exposure apparatus 40 of FIG. 2 and described above), and light detector 44b is disposed along axis A' such that it receives light reflected by beam splitter 42 prior to the light entering front condensing lens 15a. The outputs of light detectors 24 and 44b are inputted into light detection system 26, where the transmittance of optical exposure apparatus 50 is derived based on the difference in the light detector outputs. In this configuration, fluctuations in the intensity of light emitted by light source 10 are detected by both light detectors 24 and 44b and can thus be subtracted from the transmittance calculation. Note again that beam splitter 42 may be placed anywhere in optical exposure system 50. For example, if the transmittance of projection lens 21 is to be determined, beam splitter 42 can be disposed between reticle 20 and projection lens 21, with detector 44b disposed along optical axis A' formed by beam splitter 42.

Figure 3:
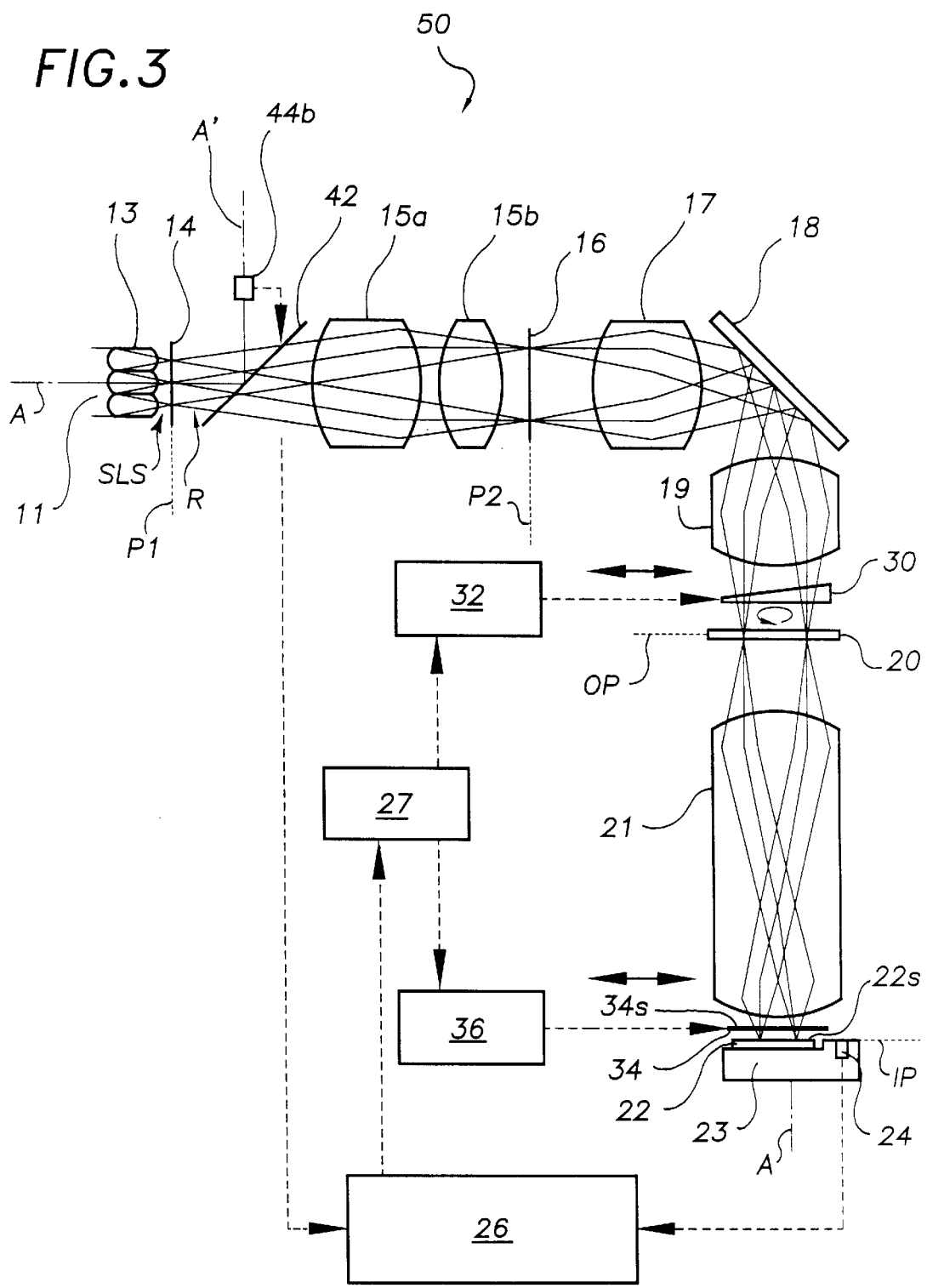
FIG. 3 is a schematic diagram of an embodiment of the optical exposure apparatus of the present invention, which includes a deflection prism, a light detector located on the workpiece stage, a beam splitter for creating a second optical path, and a light detector located therein.
Figure 4:
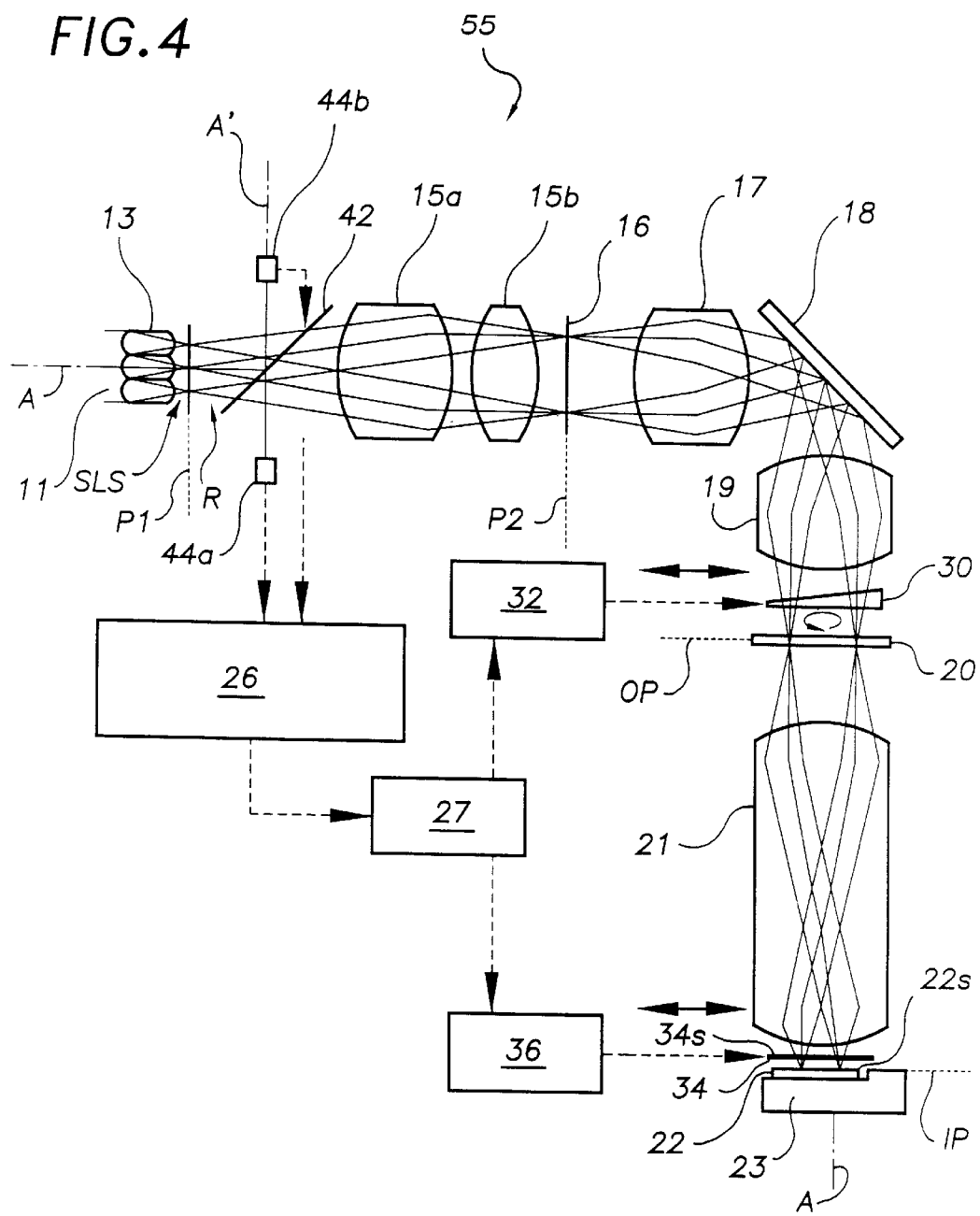
FIG. 4 is a schematic diagram of an embodiment of the optical exposure apparatus of the present invention, which includes a deflection prism, a beam splitter for creating a second and third optical paths, and a light detector located in each of the second and third optical paths.

In optical exposure apparatus 50 of FIG. 3, the light intensity at workpiece surface 22s cannot be measured when shutter 34 is closed. Thus, with reference to FIG. 4, an optical exposure apparatus 55 represents a preferred embodiment of the present invention, which is a modification of optical exposure apparatus 50 to allow for this measurement. Optical exposure apparatus 55 includes the same elements as optical exposure apparatus of FIG. 2, and it further includes light detector 44b, as shown in FIG. 3. In this configuration, light detector 44b detects light reflected by beam splitter 42 prior to the light entering front condensing lens 15a. Light detector 44a detects light reflected by reflective surface 34s of shutter 34 which passes back through optical projection system 5 and backwards through front condenser lens 15a. The outputs of light detectors 44a and 44b are inputted into light detection system 26. Comparison of the outputs from light detectors 44a and 44b allows for the transmittance of optical exposure apparatuses between front condensing lens 15a and shutter 34 to be continuously monitored, regardless of the fluctuation in light intensity emitted by light source 10, when shutter 34 is closed.

Figure 5:
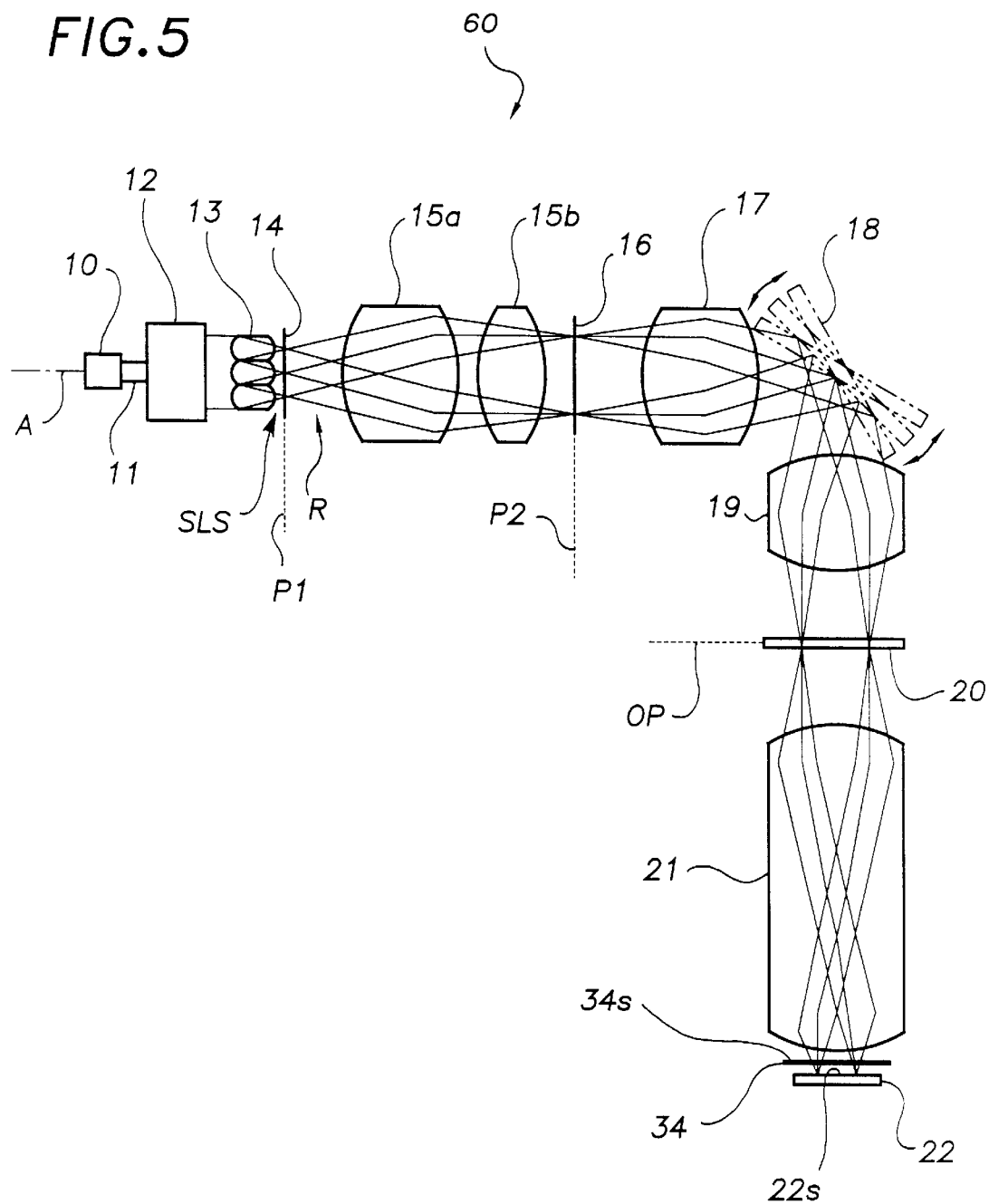
FIG. 5 is a schematic diagram of an embodiment of the optical exposure apparatus of the present invention, which includes a rotating mirror.

Optical exposure apparatuses 5, 40, 50, and 55, discussed above, all employ deflection prism 30 to deflect the optical path during photo-cleaning. With reference now to FIG. 5, optical exposure apparatus 60 represents a preferred embodiment of the present invention which employs a different means for deflecting the light path to perform photo-cleaning. Optical projection exposure apparatus 60 includes the same elements as optical exposure apparatus of FIG. 1, except that deflection prism 30 is no longer present. Instead, fold-mirror 18 is made movable in two-dimensions (FIG. 5 illustrates the movement in one-dimension). For example, fold-mirror 18 may be rapidly oscillated in two dimension about its center or some other position. Moreover, the movement of fold-mirror 18 may be combined with a lateral shift. The movement of fold-mirror 18, as described above, serves to deflect the optical path to peripheral portions of the optical components in optical apparatus 60 during photo-cleaning. Note that fold-mirror 18, like deflection prism 30, can be located in at any other convenient location in the illumination optical system.

Figure 6:
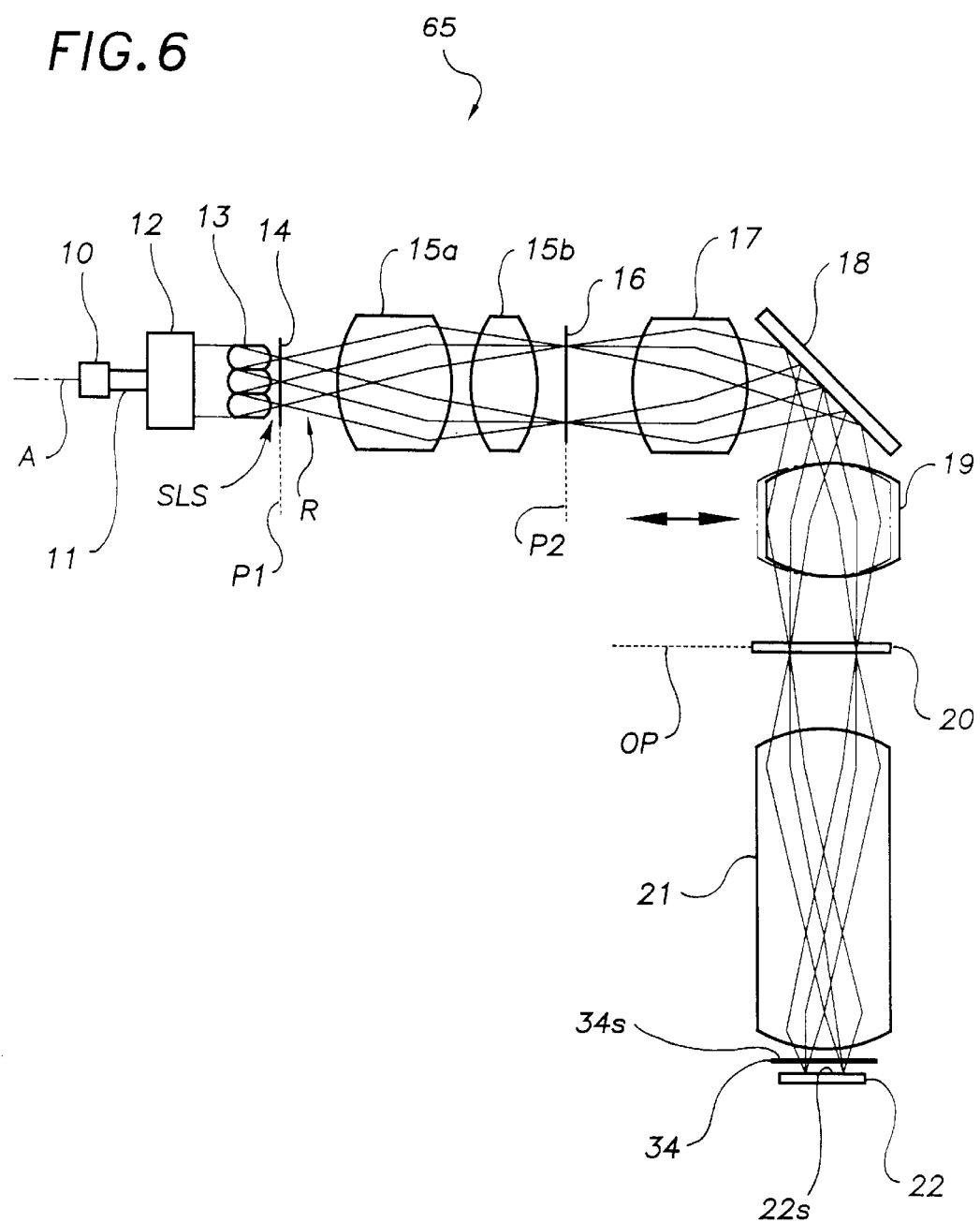
FIG. 6 is a schematic diagram of an embodiment of the optical exposure apparatus of the present invention, which includes a movable lens component.

With reference now to FIG. 6, optical exposure apparatus 65 represents another preferred embodiment of the present invention which employs a different means for deflecting the light path to perform photo-cleaning. Optical exposure apparatus 65 includes the same elements as optical exposure apparatus of FIG. 1, except that deflection prism 30 is no longer present. Instead, objective lens 19 may be moved rapidly back and forth (i.e., oscillated) in a direction perpendicular to optical axis A passing therethrough. Objective lens 19 may also simultaneously be moved along optical axis A passing therethrough. The movement of objective lens 19, as described above, serves to deflect light in the optical path during photo-cleaning. Note that other optical components in optical exposure apparatus 65, such as condenser lenses 15a and/or 15b can be can be made movable in instead of, or in addition to, objective lens 19.

Figure 7:
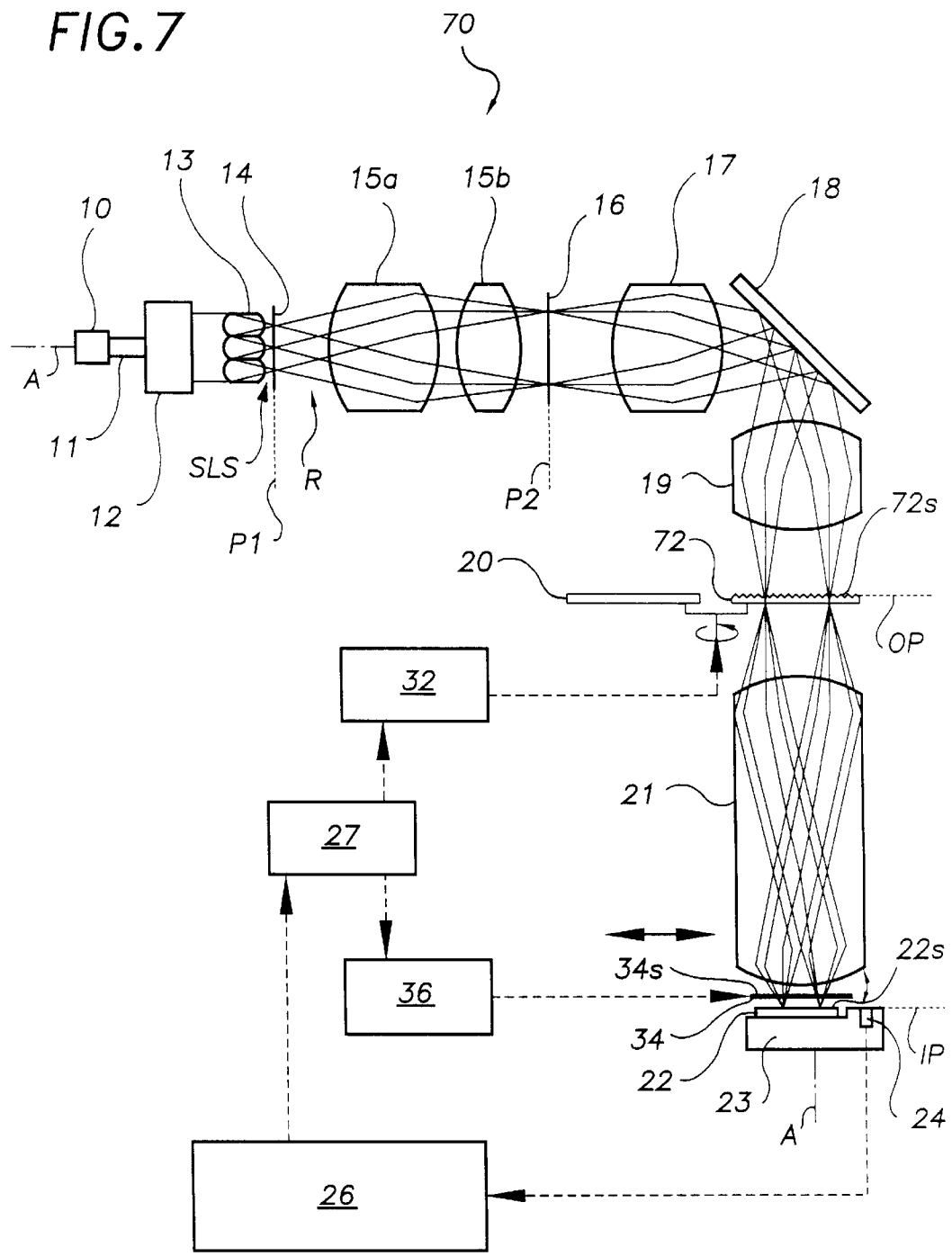
FIG. 7 is a schematic diagram of an embodiment of the optical exposure apparatus of the present invention, which includes a diffusion plate, and a single light detector located on the workpiece stage.
Figure 8:
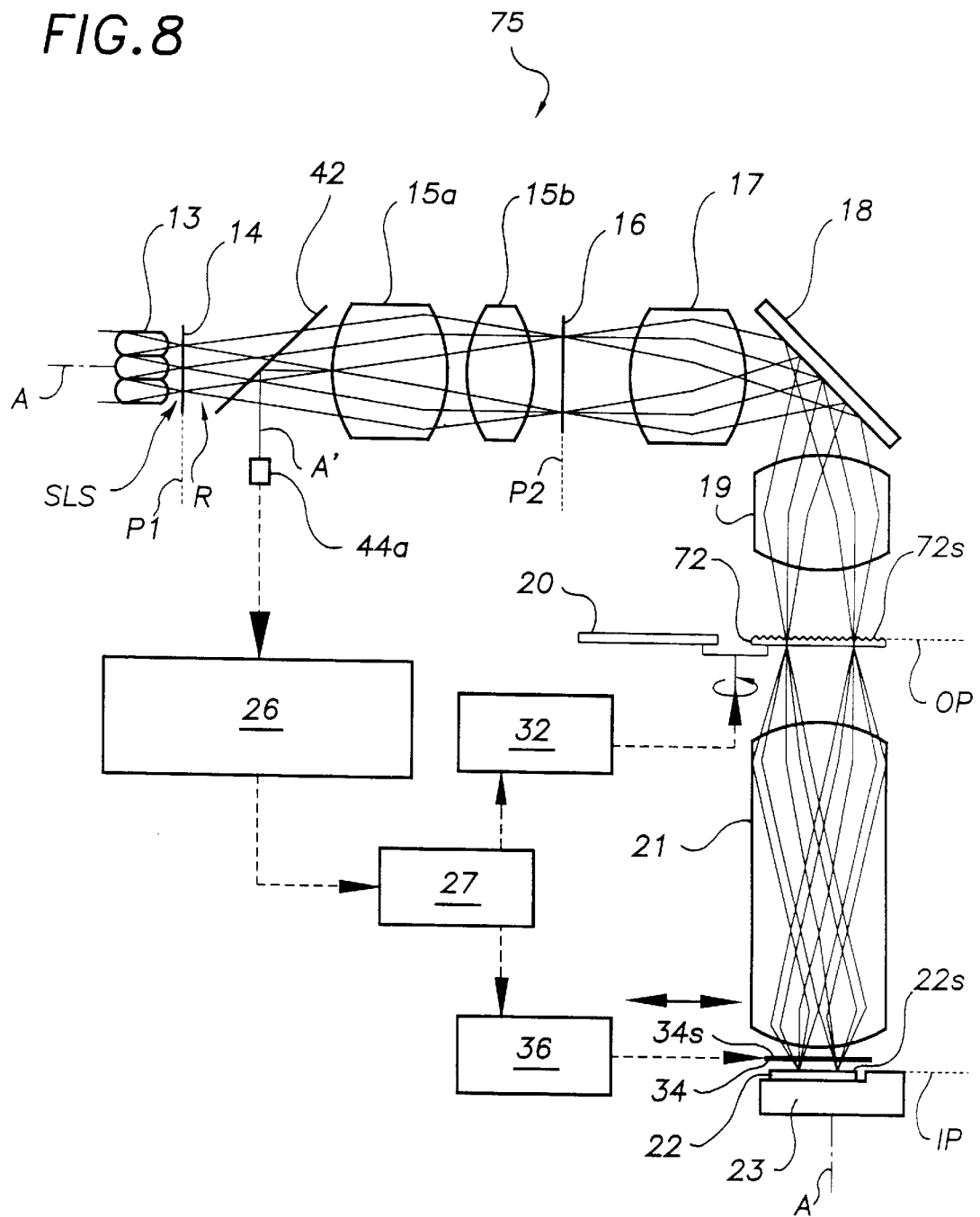
FIG. 8 is a schematic diagram of an embodiment of the optical exposure apparatus of the present invention, which includes a diffusion plate, a beam splitter for creating a second optical path, and a single light detector located therein.
Figure 9:
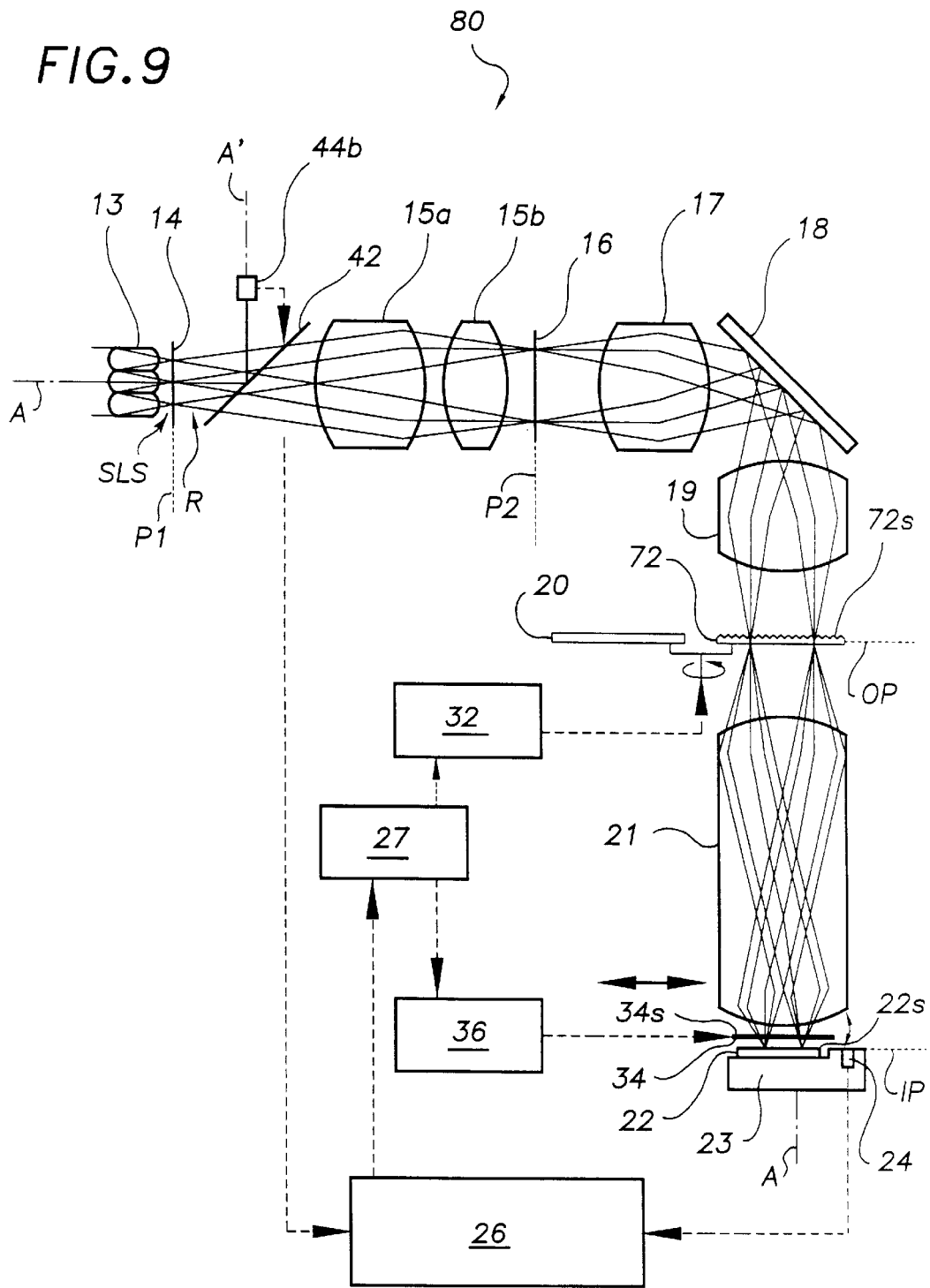
FIG. 9 is a schematic diagram of an embodiment of the optical exposure apparatus of the present invention, which includes a diffusion plate, a light detector located on the workpiece stage, a beam splitter for creating a second optical path, and a light detector located therein.
Figure 10:
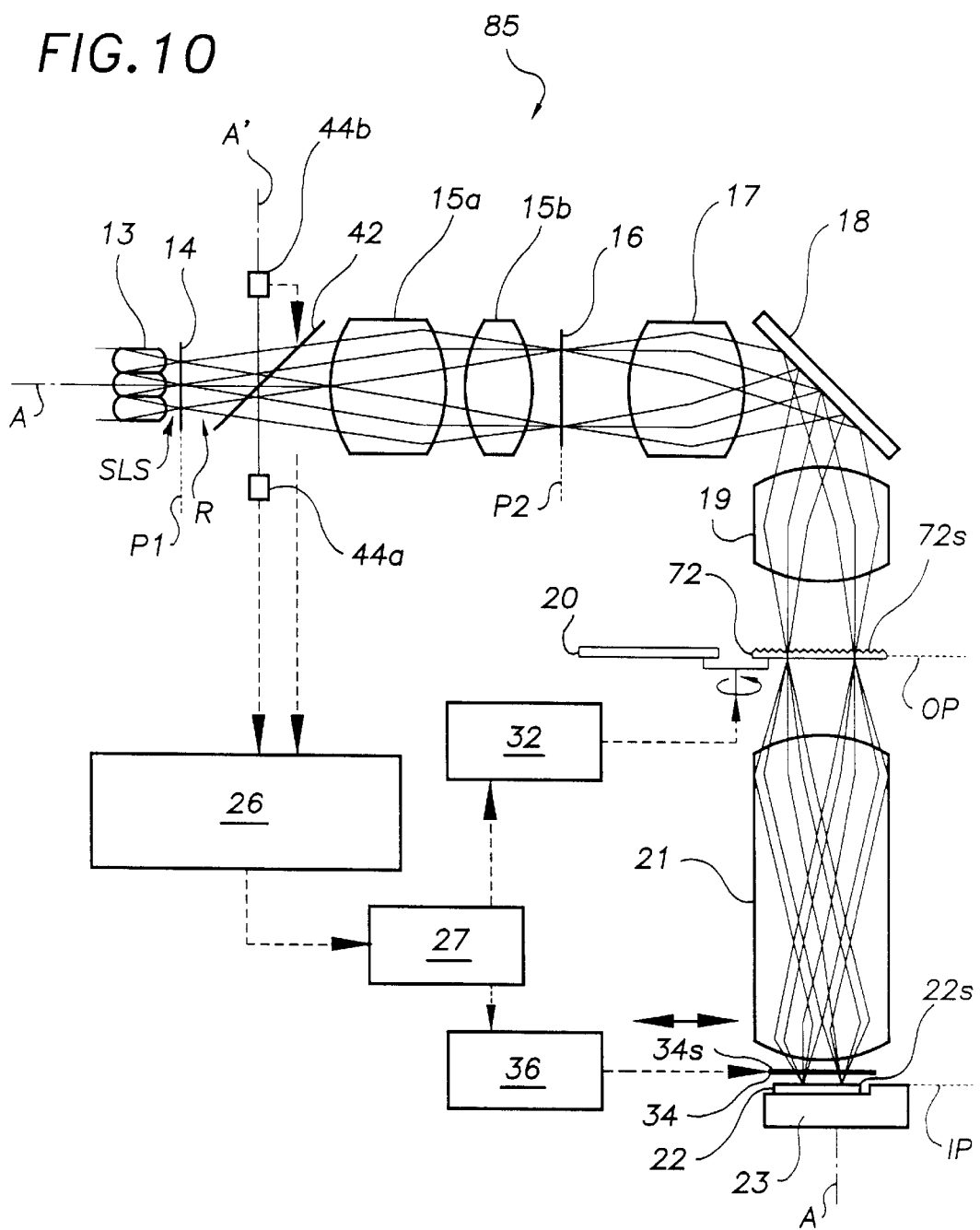
FIG. 10 is a schematic diagram of an embodiment of the optical exposure apparatus of the present invention, which includes a diffusion plate, a beam splitter for creating a second and third optical paths, and a light detector located in each of the second and third optical paths.

With reference now to FIG. 7, optical exposure system 70 is another preferred embodiment of the present invention which employs yet another means for deflecting light in the optical path to perform photo-cleaning. Optical exposure system 70 includes the same elements as FIG. 1, except that deflection prism 30 is absent. Instead, a light diffusing member, such as a diffusion plate 72 is inserted at or near object plane OP of projection lens 21. Diffusion plate 72 is connected to drive system 32, which removes reticle 20 and inserts diffusion plate 72 in its place for photo-cleaning. Drive system 32 also removes diffusion plate 72 and inserts reticle 20 in its place for exposure. Diffusion plate 72 may be, for example, a fused quartz or calcium fluoride plate having a pattern etched in on one of its surfaces, such as surface 72s. The pattern on surface 72s may be periodic, such a diffraction grating, to diffract light incident thereon, or may be random to scatter light incident thereon. The degree to which diffusion plate 72 diffuses light can be characterized by a diffusion angle Δ', similar to the deflection angle of the deflection prism, discussed above. If the diffusion angle Δ' is too large due to the pattern on surface 72s being too rough, it can be controlled by processing the surface with chemicals such as hydrofluoric acid (hydrogen fluoride). In addition, if diffusion plate 72 includes a diffraction grating, the diffusion angle Δ' can be controlled by adjusting the grating spacing.

As discussed above in connection with deflection prism 30 (see FIGS. 1–4), it is generally preferred to set the diffusion angle Δ' such that Δ'=$NA_P$–$NA_I$ to ensure the periphery of the optical components receive light during photo-cleaning. Also, diffusion plate 72 can be used in analogous fashion to deflection prism 30 as it is used in optical exposure apparatuses 5, 40, 50 and 55 shown in FIGS. 1–4. FIGS. 7–10 show optical exposure apparatuses 70, 75, 80 and 85 which include diffusion plate 72 and which operate in the same manner as optical exposure apparatuses 5, 40, 50 and 55, respectively, which include deflection prism 30, as discussed above.

As can be appreciated from the above discussion, realizing a robust DUV optical exposure apparatus and a method of patterning a workpiece using the apparatus is extremely difficult because of the aforementioned contamination of the optical components. It is a particularly daunting problem because it is virtually impossible to reduce the humidity to zero or to eliminate the presence of organic compounds, which are ubiquitous in a semiconductor manufacturing environment. Accordingly, it is essential to have an optical exposure apparatus and method that incorporates photo-cleaning techniques which allow for a high transmittance to be maintained when performing exposures.

Figure 11:
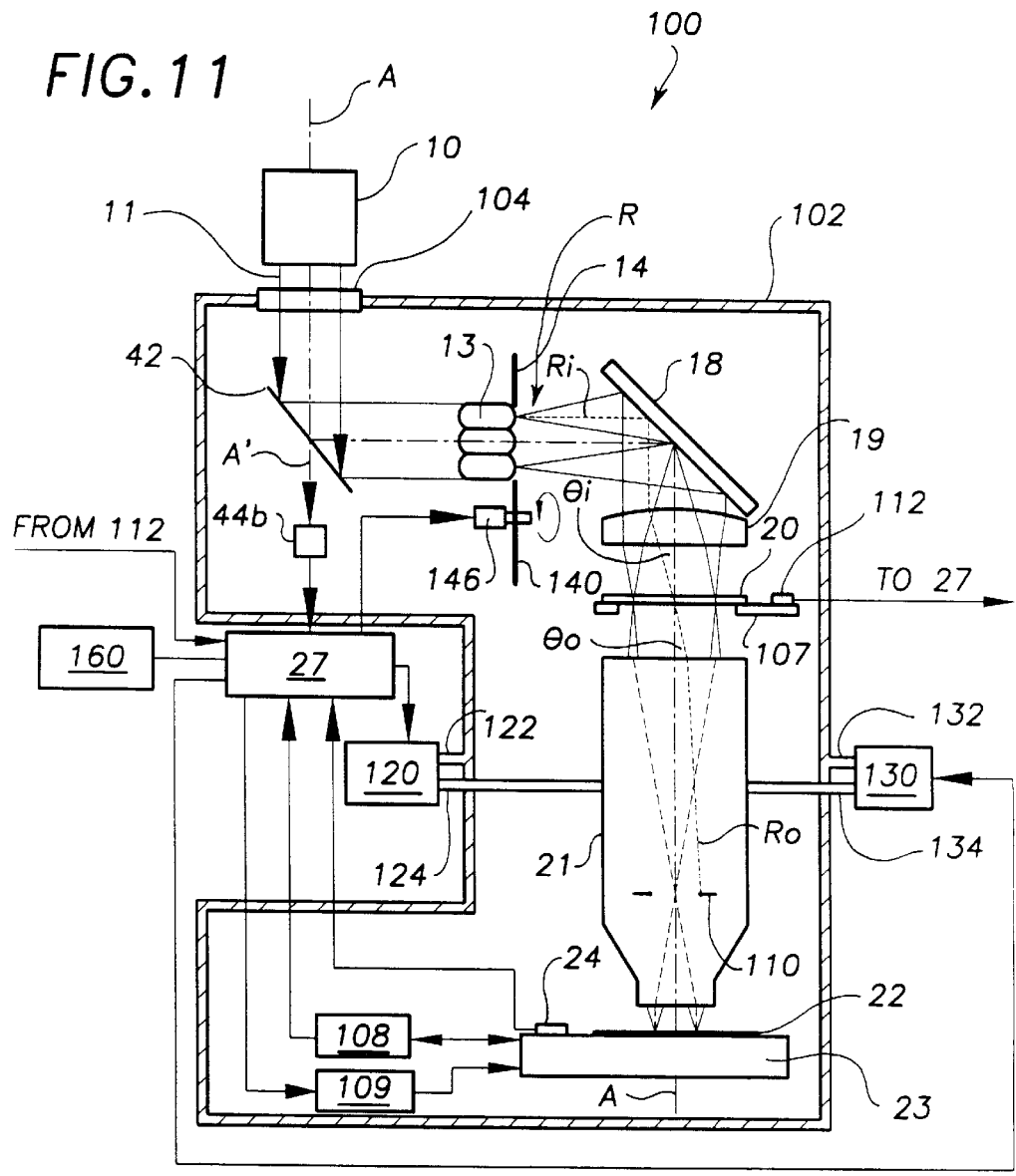
FIG. 11 is a schematic diagram of an embodiment of the optical exposure apparatus of the present invention, which includes a housing, a variable aperture stop, and gas supply and gas discharge systems connected to the housing and the projection lens.

Thus, with reference now to FIG. 11, there is shown a preferred embodiment of a projection exposure apparatus 100 of the present invention for patterning a workpiece. As shown in FIG. 11, laser light is supplied as a nearly parallel light beam from light source 10, which is, for example an ArF excimer laser that oscillates pulsed light having an output wavelength of 193 nm. This laser light beam is guided to light transmitting window 104 on the side of projection exposure apparatus 100. Accordingly, projection exposure apparatus 100 includes a chamber 102 and filled with an inert gas like nitrogen, for example, to prevent the adherence of moisture and organic matter and the like in the atmosphere, to the optical elements and the like in chamber 104.

The laser light passing through light transmitting window 104 is reflected by reflective mirror 42, and guided to optical integrator ("fly's-eye lens") 13. Fly's-eye lens 13 is constituted by bundling numerous lens elements, and a light source image is formed on the exit surface side of these lens elements. Accordingly, at the exit surface side of fly's-eye lens 13, numerous light source images (i.e., secondary light sources, not shown) corresponding to the number of lens elements comprised thereof are formed.

Nevertheless, although one fly's-eye lens 13 is provided in the present example, a fly's-eye lens can also be provided as a second optical integrator between fly's-eye lens 13 and light source 10 or reflective mirror 42. Furthermore, an internal reflection-type rod-shaped optical member can also be used in place of fly's-eye lens 13.

In addition, as discussed later in detail, a variable aperture stop 14 (changing apparatus or changing means that can change the numerical aperture $NA_I$ of the illumination optical system) which can set a plurality of aperture stops having a predetermined shape or a predetermined size at a position wherein the numerous secondary light sources formed by the fly's-eye lens 13 are formed, is included.

The light beam from the numerous secondary light sources formed by the fly's-eye lens 13 is reflected by reflective mirror 18, and subsequently condensed by condenser optical system 19, comprising a plurality of refractive optical elements, like lenses. Consequently, the pattern, such as a circuit pattern, formed on reticle 20 is superimposingly and uniformly illuminated. Then, the image of the circuit pattern on reticle 20 is formed on workpiece 22 (e.g., a wafer coated with resist) by means of projection lens 21. Consequently, the resist coated on the wafer is exposed and the circuit pattern image is transferred onto workpiece 22.

Furthermore, projection lens 21 in the present example completely comprises optical elements like refractive lenses, and an aperture stop 110 is arranged at the position of the pupil (entrance pupil) of projection lens 21. In addition, aperture stop 110 and variable aperture stop 16 are at optically conjugate positions.

Accordingly, reticle 20 is supported by reticle stage 107 that moves two-dimensionally within the plane orthogonal to the paper surface of FIG. 11. The position information from measurement systems, like an interferometer system (not shown), that measures the position of reticle stage 107 is input to control system 27 as the controlling means. Control system 27 controls the position of reticle stage 107 via a drive system (not shown) based on this position information.

In addition, workpiece 22 is mounted on workpiece stage 23 that moves two-dimensionally in the plane orthogonal to the paper surface of FIG. 11. The position information from measurement system 108, like an interferometer system, that measures the position of this wafer stage 23 is input to control system 27 as the controlling means. Control system 27 controls the position of workpiece 23 via a drive system 109 based on this position information.

In addition, in the projection exposure apparatus shown in FIG. 11, a transmittance measurement system is provided to perform measurements related to the transmittance of the illumination optical system 42 to 19 and projection lens 21. A first detector 44b related to the transmittance measurement system is arranged below reflective mirror 44b, and a second detector 24 related to the transmittance measurement system is arranged at one end of workpiece stage 23. Furthermore, a third detector 112 related to the transmittance measurement system is arranged at one end of reticle stage 107.

First, first detector 44b provided below reflective mirror 42, (which, in this case, is partially transmitting) and detects the output of ArF excimer laser light from light source 10 by photoelectrically detecting the quantity of light, and the illumination intensity and the like of the transmitted light from one part of reflective mirror 42. Then, the output from first detector 44b is input to control system 27 as the controlling means.

By setting, via drive system 109, second detector 24, provided at one end of workpiece stage 23, in the plane wherein the workpiece 22 is arranged as the surface to be irradiated (or the image plane of projection lens 21), the quantity of light and illumination intensity and the like at the plane wherein wafer 22 is arranged (or the image plane of projection lens 21) are detected. Then, the output from second detector 24 is input into control system 27 as the controlling means.

Furthermore, by setting, via a drive system (not shown), third detector 112, provided at one end of reticle stage 107, in the plane wherein reticle 20 is preferably arranged, the quantity of light and illumination intensity and the like of the illumination light beam supplied to the surface of reticle 20 are measured. Then, the output from third detector 112 is input to control system 27 as the controlling means.

A divider unit and discrimination unit (not shown) are provided inside control system 27. The divider unit outputs to the discrimination unit the value of the output from second detector 24 divided by the output from first detector 44b (value corresponding to the light transmittance of reflective mirror 42, condenser lens 19 and projection lens 21), or the value of the output from third detector 112 divided by the output from second detector 24 (value corresponding to the light transmittance of projection lens 21). Then, the discrimination unit judges whether the transmittance of the projection exposure apparatus has dropped by discriminating whether the output from the divider unit has reached a predetermined threshold value. Then, discrimination unit starts the exposure operation or continuously executes the exposure operation, or judges whether to start the photo-cleaning operation.

In addition, a gas supply apparatus 120 for supplying an inert gas like nitrogen to chamber 102 and a plurality of spaces formed between a plurality of optical components inside projection lens 21, and a gas discharge apparatus 130, for discharging the gas inside chamber 102 and the gas inside a plurality of spaces formed between a plurality of optical components inside projection lens 21, are provided outside of chamber 102. Furthermore, the inert gas is not limited to nitrogen, and gases like helium and argon can also be used.

Then gas supply apparatus 120 supplies inert gas (dried inert gas) like dried nitrogen to chamber 102 through pipe 122, and also supplies inert gas (dried inert gas) like dried nitrogen into projection lens 21 through pipe 124. In addition, gas discharge apparatus 130 discharges, through pipe 132, the gas inside chamber 102, and also discharges through pipe 134 the gas inside projection lens 21. The operation of gas supply apparatus 120 together with gas discharge apparatus 130 is controlled by control system 27.

Next, variable aperture stop 14 as the changing apparatus or changing means that changes the numerical aperture $NA_I$ of the illumination optical system in projection exposure apparatus 100 discussed above, will be explained.

The σ value as the coherence factor (or, illumination coherence) is defined by the formula $\sigma=NA_I/NA_P$, wherein, $NA_I=\sin\theta_i$ is the numerical aperture of illumination optical system determined by ray $R_o$ parallel to optical axis A passing therethrough from the outermost circumference (outermost diameter) of variable aperture stop 14, and $NA_P=\sin\theta_o$ is the numerical aperture on the illumination optical system side of projection lens 21 determined by ray $R_o$ parallel to optical axis a passing through projection lens 21 from the outermost circumference (outermost diameter) of aperture stop 110 in projection lens 21, as shown in FIG. 11.

Aperture stop 110 is optically conjugate to variable aperture stop 14 in the illumination optical system. Since the image of variable aperture stop 14 (image of secondary light sources) is formed at the pupil of projection lens 21, the σ value as the coherence factor can also be defined by the following formula, wherein $D_{14}$ is the diameter of the image of variable aperture stop 14, and $D_{110}$ is the diameter of aperture stop 110 of projection lens 21:

$$\sigma=D_{14}/D_{110}.$$

Generally, projection exposure apparatus is constituted so that the a value of the projection exposure apparatus in the photolithography process is set to the range of 0.3–0.8. In the present example, variable aperture stop 14 shown in FIG. 11 is settably provided at the secondary light source position formed by fly's-eye lens 13.

Figure 12:
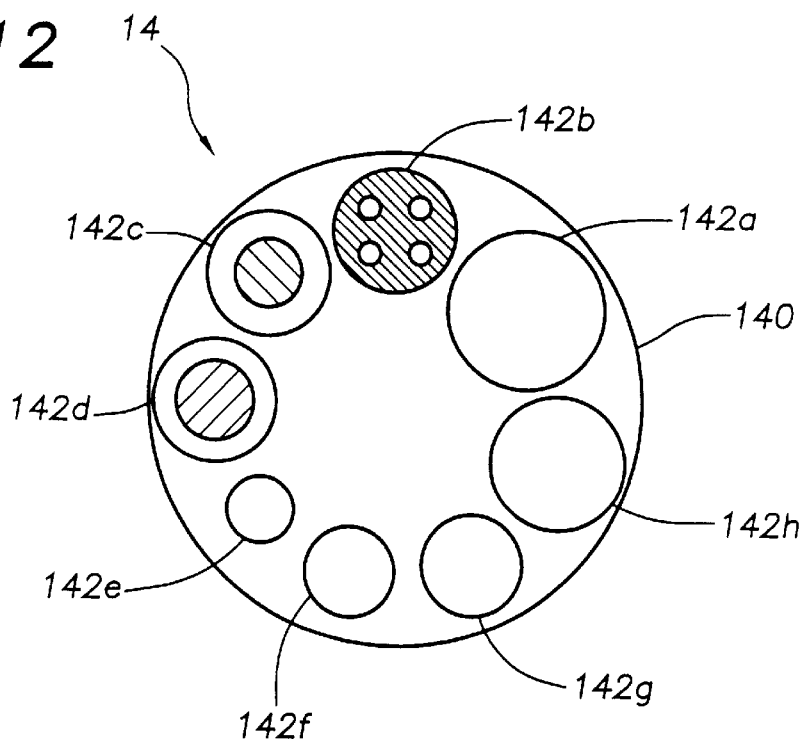
FIG. 12 is a front view of the variable aperture stop utilized in the optical exposure apparatus of FIG. 11, wherein the aperture stop has eight different apertures.

FIG. 12 shows a more concrete configuration of variable aperture stop 14 shown in FIG. 11. As shown in FIG. 12, variable aperture stop 14 has turret plate 140 having eight aperture stops 142a–142h formed on a transparent substrate, like quartz. Aperture stops 142a, 142e to 142h having five circular apertures are for the purpose of actively changing the σ value. Among these, three aperture stops 142e, 142f, 142g are used during the actual exposure operation. The remaining two aperture stops 142a, 142h are used during the photo-cleaning operation.

Furthermore, the other three aperture stops having modified apertures are for the purpose of improving the resolving power of projection lens 21 by using them during the exposure operation. Among these, the two aperture stops 142c, 142d have annular apertures with mutually differing annular ratios. The remaining one aperture stop 142b is a stop having four off-centered apertures in order to form four off-centered secondary light sources.

Turret plate 140 having eight aperture stops 142a–142h is rotated via drive system 146, such as a motor, shown in FIG. 11. One aperture stop among the eight aperture stops, namely an aperture stop having a desired aperture shape, is set at the secondary light source position by driving system 146, which is controlled by control system 27.

Figure 13:
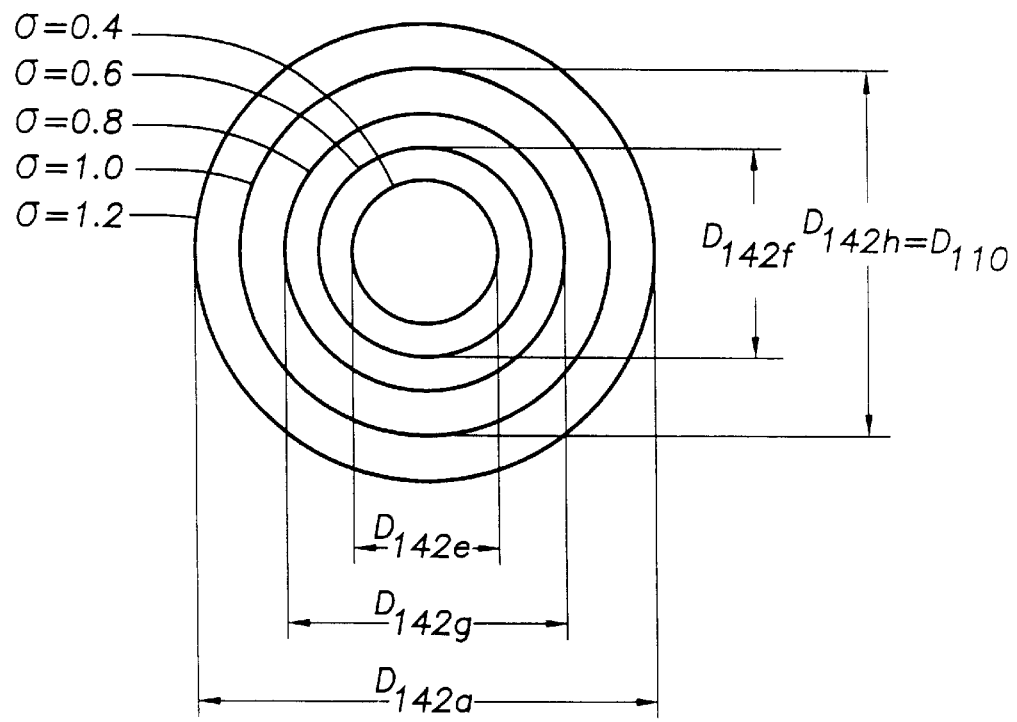
FIG. 13 shows the superposition of several of the apertures of the aperture stop of FIG. 12.

FIG. 13 shows the images of aperture stops 142a, 142e to 142h, having circular apertures of mutually differing sizes, formed on aperture stop 110 inside projection lens 21. First, if aperture stop 142e having the smallest circular aperture is set in the illumination optical path, numerical aperture $NA_I$ of the illumination optical system becomes the smallest. At this time, the image of aperture stop 142e having aperture diameter $D_{140e}$ is formed inside projection lens 110 having aperture diameter $D_{110}$ to and the σ value is set to 0.4. In other words, the relation $\sigma=D_{140e}/D_{110}=NA_I/NA_P=0.4$ is established. Accordingly, if aperture stop 142e is set inside the illumination optical path, the pattern of reticle 20 can be transferred onto workpiece 22 based on a value of 0.4.

In addition, if aperture stop 142f, having a circular aperture larger than aperture stop 142e, is set in the illumination optical path, then numerical aperture $NA_I$ of the illumination optical system becomes larger than when aperture stop 142e was set in the illumination optical path. At this point, the image of aperture stop 142f having aperture diameter $D_{140f}$ is formed inside projection lens 21 having aperture diameter $D_{110}$, and the σ value is set to 0.6. In other words, the relation $\sigma=D_{140f}/D_{110}=NA_{I/NAP}=0.6$ is established. Accordingly, if aperture stop 142f is set inside the illumination optical path, the pattern of reticle 20 can be transferred onto workpiece 22 based on a σ value of 0.6.

In addition, if aperture stop 142g, having a circular aperture larger than aperture stop 142f, is set in the illumination optical path, then numerical aperture $NA_I$ of the illumination optical system becomes larger than when aperture stop 142f was set in the illumination optical path. At this point, the image of aperture stop 142g having aperture diameter $D_{140g}$ is formed inside projection lens 21 having aperture diameter $D_{110}$, and the a value is set to 0.8. In other words, the relation $\sigma = D_{140g}/D_{110} = NA_I/NA_P = 0.8$ is established. Accordingly, if aperture stop 142g is set inside the illumination optical path, the pattern of reticle 20 can be transferred onto workpiece 22 based on a a value of 0.8.

Furthermore, if aperture stop 142h, having a circular aperture larger than aperture stop 142g, is set in the illumination optical path, then numerical aperture $NA_I$ of the illumination optical system becomes larger than when aperture stop 142g was set in the illumination optical path. At this point, the image of aperture stop 142h, having aperture diameter $D_{140h}$ the same size as the aperture diameter $D_{110}$ of aperture stop 110, is formed, and the σ value is set to 1.0. In other words, the relation $\sigma = D_{140h}/D_{110} = NA_I/NA_P = 1.0$ is established. Accordingly, if aperture stop 142h is set in the illumination optical path, the illumination light beam is sufficiently guided as far as the effective diameter of the optical elements like lenses comprising condenser lens 19 of the illumination optical system, the effective diameter of optical elements like lenses comprising projection lens 21, and as far as the part beyond the effective diameters of these optical elements. Consequently, moisture and organic matter and the like adhering to the surfaces of these optical elements can be eliminated by the photo-cleaning effect due to the exposure illumination light beam.

In addition, if aperture stop 142a, having a circular aperture larger than aperture stop 142h, is set in the illumination optical path, then numerical aperture $NA_I$ of the illumination optical system becomes larger than when aperture stop 142h was set in the illumination optical path. At this point, the image of aperture stop 142a having aperture diameter $D_{140a}$ is formed so that it includes aperture stop 142a having aperture diameter $D_{110}$, and the a value is set to 1.2. In other words, the relation $\sigma = D_{140a}/D_{110} = NA_I/NA_P = 1.2$ is established. Accordingly, if aperture stop 142a is set in the illumination optical path, the illumination light beam is sufficiently guided as far as the effective diameter of the optical elements like lenses comprising condenser lens 19 of the illumination optical system, the effective diameter of optical elements like lenses comprising projection lens 21, naturally, and as far as the lens circumference part beyond the effective diameters of these optical elements. Consequently, an effect can be sufficiently obtained wherein moisture and organic matter and the like adhering to the surfaces of these optical elements is photo-cleaned.

Next, the operation of the present example is explained. First, it became apparent through various experiments that, as shown in FIG. 11, the transmittance of the optical system part of projection exposure apparatus 100 drops if the illumination light beam as the exposure light is not guided to the optical system part of the projection exposure apparatus, even in a state in which chamber 102 is filled with an inert gas like dried nitrogen and isolated from the atmosphere. Consequently, when performing the photolithography process to manufacture a semiconductor device, Step 1 is executed wherein the transmittance of the optical system part of projection exposure apparatus 100 (i.e., reflective mirror 42 of the illumination optical system, condenser lens 19, projection lens 21 and the like) is verified by the transmittance measurement system before starting up optical exposure apparatus 5, for example (see FIG. 1), and proceeding to the exposure operation. Furthermore, the phenomenon wherein the transmittance of transmissive optical elements like condenser lens 19 and projection lens 21 drops appears if the phenomenon wherein the reflectance of reflective optical elements, such as reflective mirror 18 and the like, is reduced.

First, in Step 1, if projection exposure apparatus 100 transitions to a start-up state via a power supply (not shown) and light from light sources 10 is from an ArF excimer laser, and reticle 20 is not present, control system 27 sets second detector 24, provided at one end of workpiece stage 23, in the exposure plane of projection lens 21 via drive system 109.

Next, control system 27 discriminates, based on the output from first detector 44b provided below reflective mirror 42 together with the output from second detector 24 provide at one end of workpiece stage 23, whether the light transmittance of a predetermined optical system part of projection exposure apparatus 100 has reached a predetermined value. In other words, the divider unit inside control system 27 calculates the ratio of both outputs based on the output from first detector 4 and the output from second detector 12. Subsequently, the discrimination unit inside control system 27 discriminates, based on the calculation results thereof, whether the output from the divider unit has reached a predetermined threshold value. If the output from the divider unit has not reached a predetermined threshold value, operation transitions to Step 3 as the exposure operation discussed later, by means of this discrimination unit. If the output from the divider unit has reached the predetermined threshold value, operation proceeds to the next Step 2 as the photo-cleaning process, by means of this discrimination unit.

Furthermore, in Step 1, it is preferable that control system 27 discriminates, based on the output from second detector 24 provided at one end of workpiece stage 23, together with the output from third detector 112 provided at one end of reticle stage 107, whether the light transmittance of projection lens 21 of projection exposure apparatus 100 has reached a predetermined value, and judges whether to proceed to Step 2 after further including the discrimination results related to the light transmittance of projection lens 21. At this point, in order to obtain the output from third detector 112, it is necessary that control system 27 set third detector 112, provided at one end of reticle stage 107, in the plane wherein the reticle should preferably be arranged.

In Step 2, to execute the photo-cleaning process, control system 27 first sets the aperture size of variable aperture stop 14 via drive system 146. Accordingly, control system 27 rotates turret plate 140 via drive system 146, and sets an appropriate aperture stop, 142a or 142h, in the illumination optical path so that the a value is 1 or greater.

To paraphrase, control system 27 rotates turret plate 140 via drive system 146 and sets an appropriate aperture stop, 142a or 142h, in the illumination optical path so that the following relation is satisfied:

$NA_I \geq NA_P$.

Consequently, an illumination light beam is sufficiently guided as far as the effective diameter of the optical elements like lenses comprising condenser lens 19 of the illumination optical system, the effective diameter of the optical elements like lenses comprising projection lens 21 and, further, the part beyond the effective diameters of these optical elements. As a result, moisture and organic matter and the like adhering to the surfaces of these optical elements can be eliminated by the photo-cleaning effect due to the exposure illumination light beam.

In addition, there is a possibility that the moisture and organic matter and the like that separated from the surfaces of optical elements by means of the photo-cleaning effect due to the irradiation of the exposure illumination light beam may be suspended in chamber 102 or in a predetermined plurality of spaces formed between a plurality of optical elements. Consequently, control system 27 operates gas supply apparatus 120 together with gas discharge apparatus 130 to forcibly discharge to outside the apparatus moisture and organic matter and the like that separated from the surfaces of optical elements. In other words, based on a command from control system 27, gas supply apparatus 120 supplies inert gas like newly dried nitrogen into chamber 102 through pipe 122 and inside projection lens 21 through pipe 124, respectively. Simultaneously therewith, gas discharge apparatus 130, based on a command from control system 27, discharges to outside of projection exposure apparatus 100 the inert gas that includes moisture and organic matter and the like inside chamber 102 through pipe 132, and the inert gas that includes moisture and organic matter and the like inside projection lens 21 through pipe 134.

Based thereon, since chamber 102 and projection lens 21 are filled with inert gas like nitrogen that has been cleaned by eliminating moisture and organic matter and the like, the transmittance of the optical system part of the projection exposure apparatus can be restored to its original state. Furthermore, although inert gas like newly dried nitrogen is supplied respectively into chamber 102 as well as projection lens 21 by gas supply apparatus 120 during the photo-cleaning process of Step 2, it is preferable to adopt a configuration wherein a strong oxidizing gas like oxygen ($O_2$), ozone ($O_3$) or active oxygen ($O^*$) is mixed into the inert gas like nitrogen to be supplied. As a result, the photo-cleaning effect is accelerated by the action of the strong oxidizing gas, and a larger effect can be expected. Also, at the same time as the transition from the exposure process of Step 1 to the photo-cleaning process of Step 2, air is flowed into at least one of chamber 102 or projection lens 21. Subsequently, the photo-cleaning process of Step 2 can be started in an air environment, and can be gradually replaced by the inert gas.

When the photo-cleaning process of Step 2 is completed, operation transitions to the exposure operation as the third step. In Step 3, the actual exposure operation is executed. First, when reticle 20 is set on reticle stage 107 (namely the pattern surface of reticle 20 is set in the object plane of projection lens 21), control system 27 sets the exposure surface 22s of workpiece 22, supported by workpiece stage 23 via drive system 109, in the image plane of projection lens 21. Simultaneously therewith, control system 27 sets the aperture size of variable aperture 14 via drive system 146.

Accordingly, the exposure conditions, like the σ value, and the exposure map, in accordance with which workpiece 22 to be exposed is sequentially carried with each exposure completion, are pre-input into the memory unit (not shown) inside control system 27 via input system 160, which may be a console. Based on this input information, control system 27 rotates turret plate 140 via drive system 146, and sets one desired aperture stop from among six aperture stops 142b to 142g for exposure. Based thereon, the pattern of reticle 20 under the condition of the desired a value can be transferred onto workpiece 22 in a state wherein the transmittance of a predetermined optical system of the projection exposure apparatus is restored. As a result, a satisfactory microscopic pattern image can be faithfully transferred onto workpiece 22 and highly integrated satisfactory semiconductor devices can be manufactured with high throughput.

Furthermore, even if the exposure operation of the above Step 3 is executed, there are cases where contaminants like moisture and organic matter adhere inside chamber 102 and projection lens 21, reducing the transmittance of the optical system in the projection exposure apparatus 100.

Consequently, if n is given as an integer 1 or greater, the exposure operation is first stopped, operation returns to Step 1 and the transmittance is measured after the exposure is completed of the $n^{th}$ photosensitive substrate since the start of exposure and before the exposure of the $n+1^{th}$ photosensitive substrate is executed. For example, operation returns to the transmittance measurement process of Step 1 in a periodic step every time the exposure of 300–500 workpiece (wafers) 22 is completed. Then, control system 27 again confirms the transmittance of a predetermined optical system part of projection exposure apparatus 100 (reflective mirror 18 of the illumination optical system, condenser lens 19 and projection lens 21 and the like) by means of the transmittance measurement system.

If a drop in the transmittance of a predetermined optical system part of the projection exposure apparatus is not confirmed, operation returns again to Step 3 and the exposure operation continues. If a drop in the transmittance of a predetermined optical system part of the projection exposure apparatus is confirmed, operation returns again to Step 2 and the photo-cleaning process is executed.

As can be understood from the above, since the illumination light beam is guided as far as a part beyond the effective diameter of each optical element of the optical system during exposure, it is preferable to change the numerical aperture of the illumination optical system so that the condition $NA_{I1} > NA_{I2}$ in the present example is satisfied, wherein $NA_{I1}$ is the numerical aperture of the illumination optical system in the photo-cleaning process of the abovementioned Step 2, and $NA_{I2}$ is the numerical aperture of the illumination optical system in the exposure process of the abovementioned Step 2.

Furthermore, since the illumination light beam is more reliably and sufficiently guided as far as the part beyond the effective diameter of each optical element of the optical system during exposure, it is preferable to change the numerical aperture of the illumination optical system so that the condition $NA_{I1} \geq NA_P$ (in other words, the condition of $\sigma \geq 1$) is satisfied.

Furthermore, in the example discussed above, the fact that the σ value in the photo-cleaning process is set to 1 or above was mentioned. However, the present invention is not limited thereto, and the numerical aperture of the illumination optical system in the photo-cleaning process may be set so that the maximum σ value is larger than the maximum σ value during the exposure operation. In this case, in order to obtain a more satisfactory photo-cleaning effect, it is preferable to satisfy the following relation:

$$NA_I \geq 0.85 NA_P$$

or $$NA_{I1} \geq 0.85 NA_P$$

In addition, in the example discussed above, if photo-cleaning is performed in the photo-cleaning process using a reticle for photo-cleaning having a predetermined pattern like a diffractive grating, a greater photo-cleaning effect can be expected, since the light due to the diffracted light of the reticle for photo-cleaning and the like can be guided throughout the optical system.

The above working example discussed the case wherein projection lens 21 completely comprised refractive optical elements. However, the present invention is not limited thereto, and may comprise a catadioptric-type projection lens that includes refractive-type optical elements like lenses and reflective-type optical elements like mirrors. Furthermore, projection lens 21 may also mostly or completely comprise reflective-type optical elements like mirrors. If projection lens 21 comprises mainly reflective-type optical elements like mirrors, the measurement of the reflectance of the optical system predominates over the transmittance of the optical system, but is still included in the concept of the present invention wherein the transmittance of the optical system is measured. Furthermore, since the wavelength of the light recognized as necessary for photo-cleaning is a short wavelength under 200 nm, it is extremely effective to provide a photo-cleaning function in an optical exposure apparatus that exposes with a light source having a short wavelength under 200 nm.

Next, an example related to a method for manufacturing a projection lens for a projection exposure apparatus will be explained.

Figure 14:
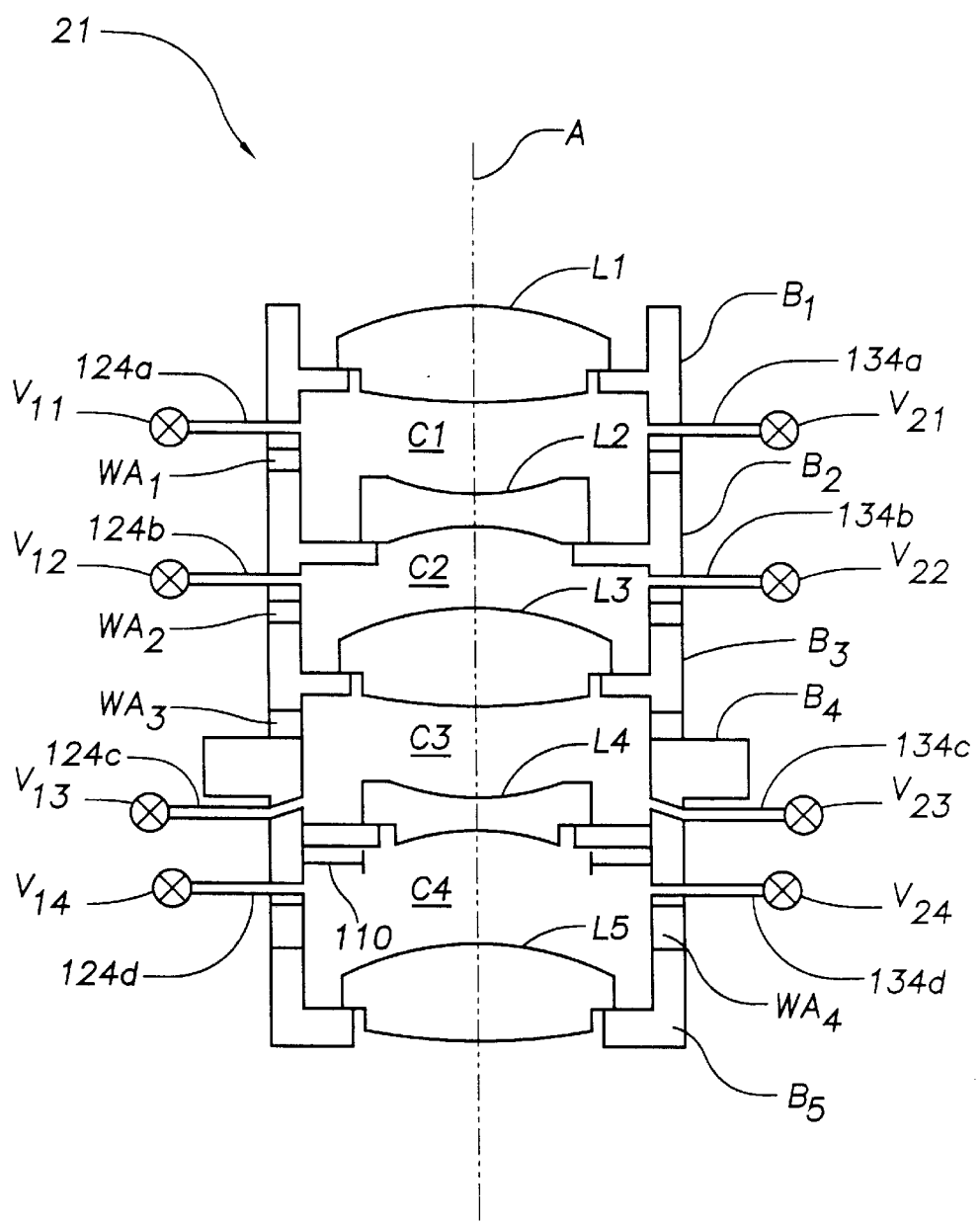
FIG. 14 is a schematic diagram of a preferred embodiment of a projection lens of the present invention which has several lens chambers and supply and discharge conduits for permitting gas flow through the chambers.

With reference to FIG. 14, in Step 1, lens elements $L_1$–$L_5$, as the optical elements comprising the projection lens in accordance with design values (e.g., predetermined lens data), and lens barrels $B_1$–$B_5$ that support the lens elements, are manufactured. Specifically, lens elements $L_1$–$L_5$ are first fabricated using well-known lens fabrication machines so that they have a radius of curvature and on-axis thickness in accordance with the predetermined design values respectively based on predetermined optical materials. Subsequently, an antireflection film is formed on the surfaces of the fabricated lens elements $L_1$–$L_5$ in order to efficiently transmit light of the exposure wavelength (hereafter, light of 193 nm) by means like well-known vapor deposition apparatuses. Lens barrels $B_1$–$B_5$ that support the lens elements are fabricated using well-known metalworking machines to a shape having predetermined dimensions respectively based on the predetermined materials (stainless steel and brass and the like). In addition, through-holes for injecting and discharging inert gas like nitrogen are fabricated in predetermined lens barrels $B_1$–$B_5$, by means of metalworking machines.

When the manufacture of parts comprising projection lens 21 is completed, as described above, operation transitions to the projection lens 21 assembly process in Step 2. In Step 2, Lens elements $L_1$–$L_5$ manufactured in Step 1 are assembled in lens barrels $B_1$–$B_5$ manufactured in the same Step 1, as shown in FIG. 14, and five divided lens barrel units are manufactured. Furthermore, at this point, injection pipes 124a–124d, to which injection side valves $V_{11}$–$V_{14}$ are attached, and discharge pipes 134a–134d, to which discharge side valves $V_{21}$–$V_{24}$ are attached, are attached to numerous through holes formed in predetermined five lens barrels $B_1$–$B_5$.

As shown in FIG. 14, when the manufacture of the above five divided lens barrel units is completed, assembly of the divided lens barrel units is completed by ordering and adjusting each divided lens barrel unit while interposing washers $WA_1$–$WA_4$. Then, after the projection lens is assembled, in order to confirm the optical performance thereof, a test pattern (not shown) is arranged at the object plane (not shown) of projection lens 21, for example, and the test pattern image (not shown) formed at the image plane (not shown) of projection lens 21 is observed through a television camera (not shown). When the assembly process of projection lens 21 in the above Step 2 is completed, operation transitions to the photo-cleaning process.

The work in the above Step 1 and Step 2 must basically be performed in the atmosphere (air). In such an environment, moisture and organic matter contained in the atmosphere adheres to the surfaces of lens elements $L_1$–$L_5$, resulting in greatly decreasing the transmittance of the assembled projection lens 21.

Accordingly, in Step 3, projection lens 21 assembled in Step 2 is irradiated with light of a wavelength the same as the exposure light, and the moisture and organic matter adhering to the surfaces of the lens elements comprising projection lens 21 are eliminated. Furthermore, since the wavelength of light recognized as necessary to perform photo-cleaning is a short wavelength under 200 nm, it is effective to use the photo-cleaning process when manufacturing a projection lens for an optical exposure apparatus that exposes with light of a short wavelength under 200 nm.

Figure 15:
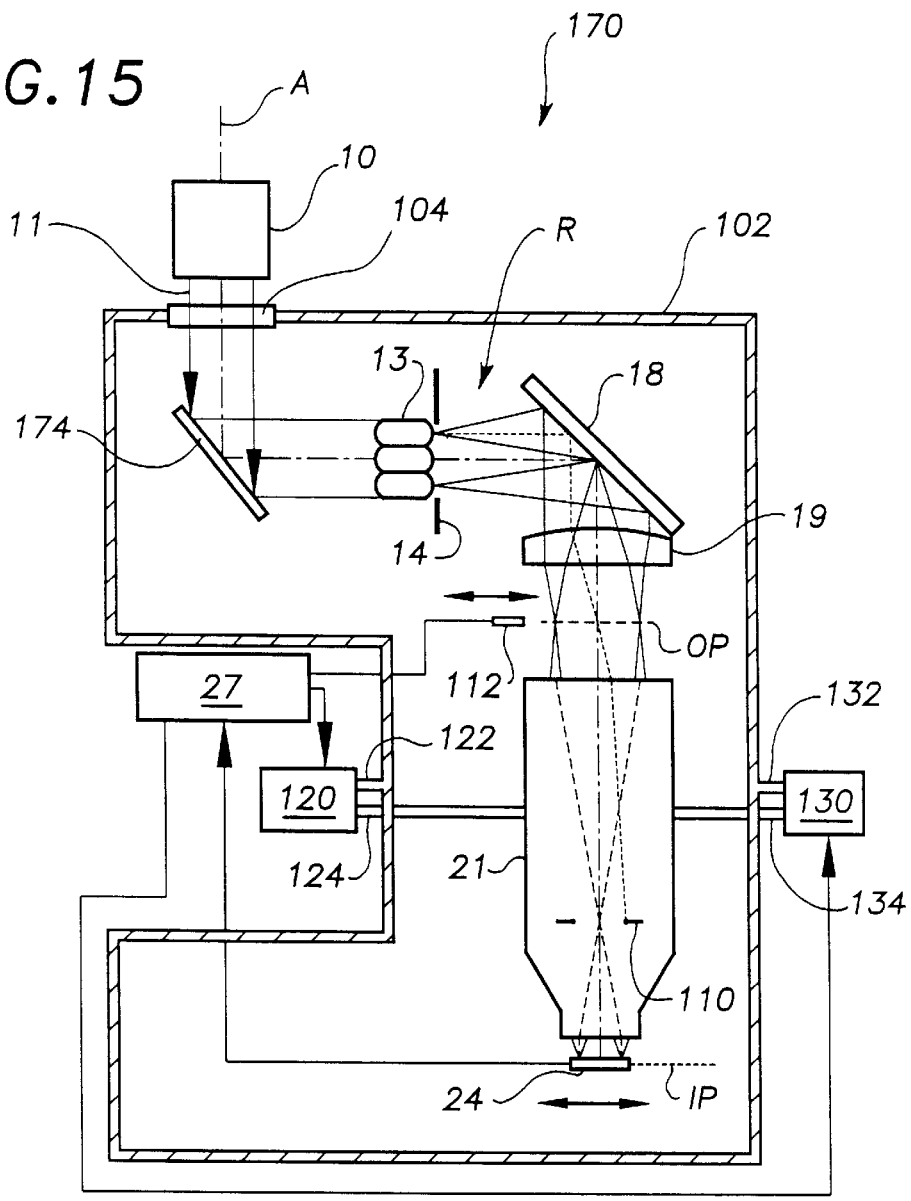
FIG. 15 is a schematic diagram of a preferred embodiment of a photo-cleaning apparatus of the present invention.

FIG. 15 shows a schematic block diagram of photo-cleaning apparatus 170 for irradiating projection lens 21 assembled in Step 2 with light of a wavelength the same as the exposure light. The components comprising apparatus 170 having the same function as in projection exposure apparatus 100 of FIG. 11 are assigned the same symbols. With reference to FIG. 15, projection lens 21 assembled in Step 2 is first mounted inside chamber 102 of the photo-cleaning apparatus. In other words, projection lens 21 is mounted so that object plane OP of projection lens 21 coincides with surface to be irradiated at the rear focal position of condenser lens 19 in the illumination optical system. Next, four injection pipes 124a–124d, to which injection valves $V_{11}$–$V_{14}$ are attached, as shown in FIG. 14, are connected to injection pipe 124 shown in FIG. 15. In addition, four discharge pipes 134a–134d to which discharge valves $V_{21}$–$V_{24}$ are attached, are connected to discharge pipe 134 shown in FIG. 15. When the above setup is completed, as shown in FIG. 15, control system 27 operates gas supply apparatus 120 and gas discharge apparatus 130. Inert gas like dried nitrogen is respectively supplied into chamber 102 and projection lens 21 by means of gas supply apparatus 120. The air inside chamber 102 and projection lens 21 is discharged by means of gas discharge apparatus 130. Then, the inert gas inside chamber 102 and projection lens 21 is replaced with air.

When chamber 102 and projection lens 21 are sufficiently filled with inert gas, ArF excimer laser light from light source 10, that oscillates pulsed light having an output wavelength equal to the exposure wavelength (for example, 193 nm) is guided to the photo-cleaning apparatus 170 through window 104. The laser light passing through light transmitting window 104 is reflected by reflective mirror 174, guided to fly's-eye lens 13 (i.e., optical integrator 13) and forms numerous light sources (secondary light sources) on the exit surface side of fly's-eye lens 13.

Aperture stop 14 having a circular aperture of a predetermined size is provided at the position wherein the numerous secondary light sources formed by this fly's-eye lens 13 are formed. Aperture stop 14 is constituted so that it satisfies the condition $NA_{f1} \geq NA_P$ (namely, the condition of $\sigma \geq 1$), wherein $NA_{f1}$ is the numerical aperture of the illumination optical system in the present process (photo-cleaning process).

After the light beam from the numerous secondary light sources is reflected by reflective mirror 18, it is condensed by condenser lens 19 and superimposingly and evenly illuminates the surface to be irradiated. The light beam that passed through this surface to be irradiated passes through projection lens 21. By means thereof, moisture and organic matter and the like adhering to the surface of the plurality of optical elements $L_1$–$L_5$ comprising projection lens 21 can be eliminated by the photo-cleaning effect due to the exposure illumination light beam.

Due to the photo-cleaning effect owing to the irradiation of the above exposure illumination light beam, there is a possibility that moisture and organic matter and the like that separated from the surfaces of the plurality of optical elements $L_1$–$L_5$ comprising projection lens 21 may be suspended in chamber 102 or in the predetermined plurality of spaces formed between the plurality of optical elements. Consequently, control system 27 operates, simultaneous with the execution of the photo-cleaning process, gas supply apparatus 120 and gas discharge apparatus 130 to forcibly discharge to outside the apparatus the moisture and organic matter and the like that separated from the surfaces of the optical elements. In other words, based on a command from control system 27, gas supply apparatus 120 supplies inert gas like newly dried nitrogen into chamber 102 through pipe 122 and into projection lens 21 through pipe 124, respectively. Simultaneous therewith, based on a command from control system 27, gas discharge apparatus 130 discharges to outside the projection exposure apparatus the inert gas that includes the moisture and organic matter and the like inside chamber 102 through pipe 132, and the inert gas that includes the moisture and organic matter and the like inside projection lens 21 through pipe 134.

As a result, since chamber 102 and projection lens 21 are filled with inert gas like nitrogen that has been cleaned by eliminating moisture and organic matter and the like, it is possible to restore the transmittance of projection lens 21 to its original condition.

Furthermore, when performing the photo-cleaning process of Step 3, inert gas like newly dried nitrogen is supplied by gas supply apparatus 120 into chamber 102 and projection lens 21, respectively. However, it is preferable to mix a strong oxidizing gas like oxygen ($O_2$), ozone ($O_3$) or active oxygen ($O^*$) into the inert gas like the nitrogen supplied by gas supply apparatus 120. As a result, the photo-cleaning effect is accelerated due to the action of the strongly oxidizing gas, and a greater effect can be expected.

In addition, it is preferable to measure the transmittance of projection lens 21 before and after executing the photo-cleaning process of Step 3. In this case, moveable third detector 112 is arranged along the surface to be irradiated of the illumination optical system, and moveable second detector 24 is arranged along the image plane of projection lens 21. When measuring the transmittance of projection lens 21, third detector 112 is set in the surface to be irradiated, and second detector 24 is set in the image plane of projection lens 21.

Then, control system 27 may be constituted so that, based on the output from third detector 112 and the output from second detector 24, it discriminates whether the light transmittance of projection lens 21 has reached a predetermined value. Consequently, if the light transmittance of projection lens 21 is measured before executing the photo-cleaning process of Step 3, how long the ArF excimer laser light from light source 10 should be irradiated can be estimated. In addition, if the transmittance of projection lens 21 is measured after executing the photo-cleaning process of Step 3, the restoration status of the light transmittance of projection lens 21 can be confirmed.

If it is necessary to readjust projection lens 21 at the stage where the photo-cleaning process of the above Step 3 has completed, projection lens 21 is removed from chamber 102 of projection exposure apparatus 170 in FIG. 15 and the operation returns to Step 2. In addition, if it is confirmed at the completion of Step 3 that a sufficient image formation performance for projection lens 21 was obtained in the abovementioned Step 1, the projection exposure apparatus is completed by removing the projection lens from chamber 104 of the photo-cleaning apparatus in FIG. 5, and attaching it to the optical exposure apparatus body as shown in FIG. 1.

With respect to the embodiment as shown in FIG. 11 and FIG. 15, when projection lens 21 comprises a plurality of optical mirrors (e.g., plane mirror, concave mirror or convex mirror), it is possible that the control system 27 detects a reflectance of the projection lens 21 based upon output signals from second and third detectors 24 and 112. Further with respect to the embodiment as shown in FIG. 11 and FIG. 15, when the illumination optical system comprises a plurality of optical mirrors (e.g., plane mirror, concave mirror or convex mirror), it is possible that the control system 27 detects a reflectance of the illumination optical system based upon the output signal from second detector 24.

Figure 16:
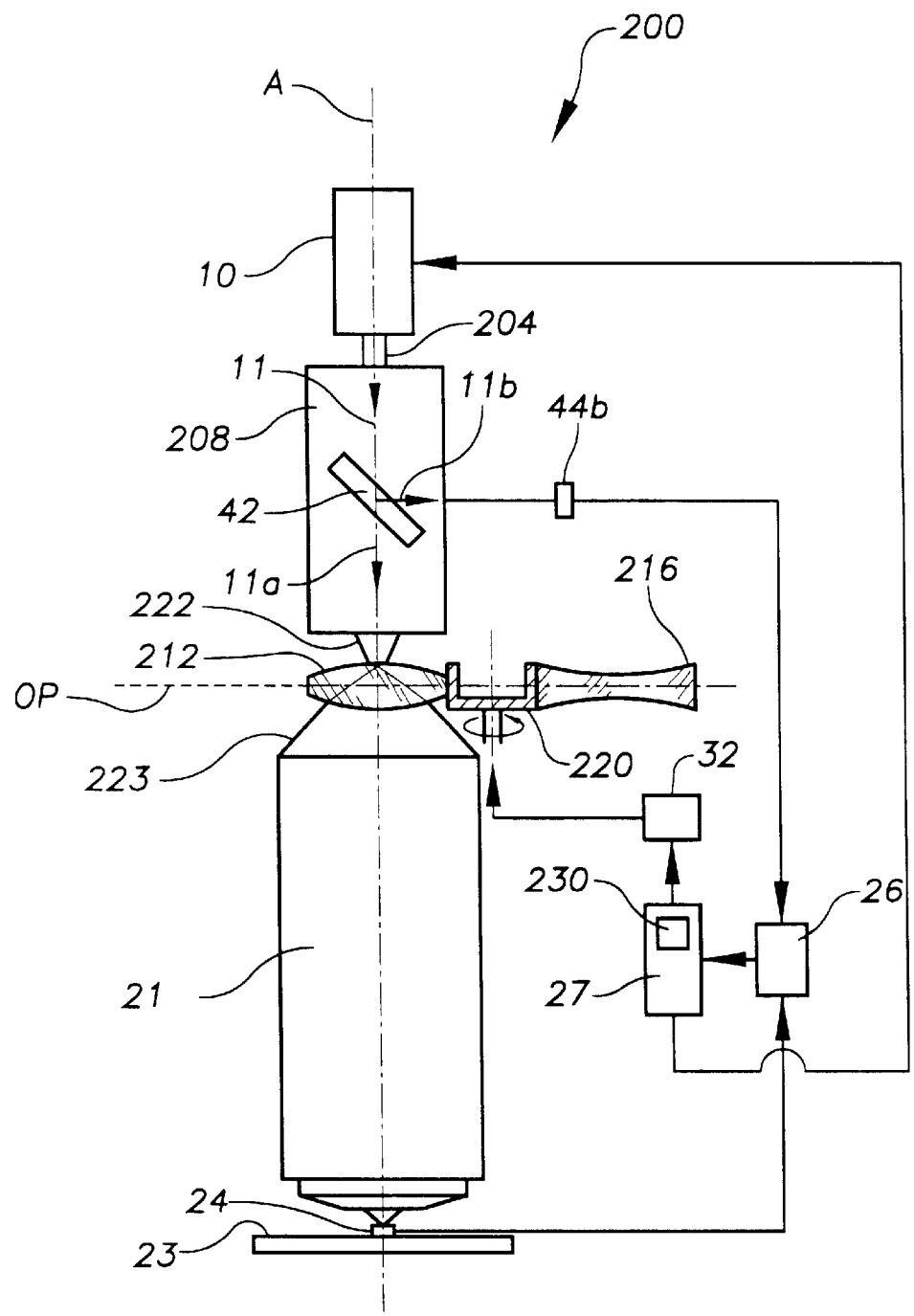
FIG. 16 is a schematic diagram of an optical exposure apparatus according to the present invention, which includes a concave lens and a convex lens as a photo-cleaning optical member.

With reference now to FIG. 16, an optical exposure apparatus 200 is described, which includes many of the same components included in optical exposure apparatus 50 of FIG. 3. Optical exposure apparatus 200 comprises, along optical axis A, a light source 10 emitting a light beam 11 and a beam matching unit 204 that connects the light source to an illumination optical system 208. Light beam 11 impinges on illumination optical system 208 through beam matching unit 204 and is bifurcated into two optical paths, 11a and 11b, by beam splitter 42 provided within illumination optical system 208. Beam splitter 42 is shown provided in the middle of optical illumination system 208, but the location of the beam splitter is not so limited. For example, beam splitter 42 may be arranged between illumination optical system 208 and optical member 212, which is described in greater detail below. Light beam 11a, which is transmitted through beam splitter 42, is used as the illumination light (i.e., forms an illumination light beam). On the other hand, light beam 11b, which is reflected by beam splitter 42, impinges on detector 44b.

Adjacent illumination optical system 208 is a photo-cleaning optical member 212 removably arranged at object plane OP, where a mask (not shown) is typically arranged. Photo-cleaning optical member 212, along with another photo-cleaning optical member 216, are supported by a support apparatus 220. Either one of photo-cleaning optical members 212 and 216 can be arranged at object plane OP of optical exposure apparatus 200 by rotationally driving support apparatus 220 by drive system 32. The mask (not shown) is arranged at object plane OP when the normal exposure process is performed. Both the mask and photo-cleaning optical members 212 and 216 are supported by support apparatus 220.

With continuing reference to FIG. 16, a light beam 222 emanates from illumination optical system 208 and is refracted by one of optical members 212 and 216. The direction of refraction depends on which photo-cleaning optical member is inserted in the optical path defined by light beam 222. Upon refraction, light beam 222 becomes light beam 223, which passes through projection lens 21 and then impinges on detector 24 arranged on workpiece stage 23. A light detection system 26 calculates the transmittance of optical exposure apparatus 200 from beam splitter 42 to detector 24 based on signals from detector 44b and detector 24. The adhesion state of contaminants on the lens surfaces (not shown) comprising projection lens 21 is determined by comparing the calculated transmittance with the design transmittance. The timing of ceasing photo-cleaning is determined by observing the progress of photo-cleaning through monitoring the change in transmittance. A control system 27 is connected to light source 10, drive system 32, and a storage unit 230, the latter of which stores data related to exposing the workpiece (not shown). The amount of exposure light is controlled via control system 27 based on the data in storage unit 230, as discussed later in more detail.

Figure 17:
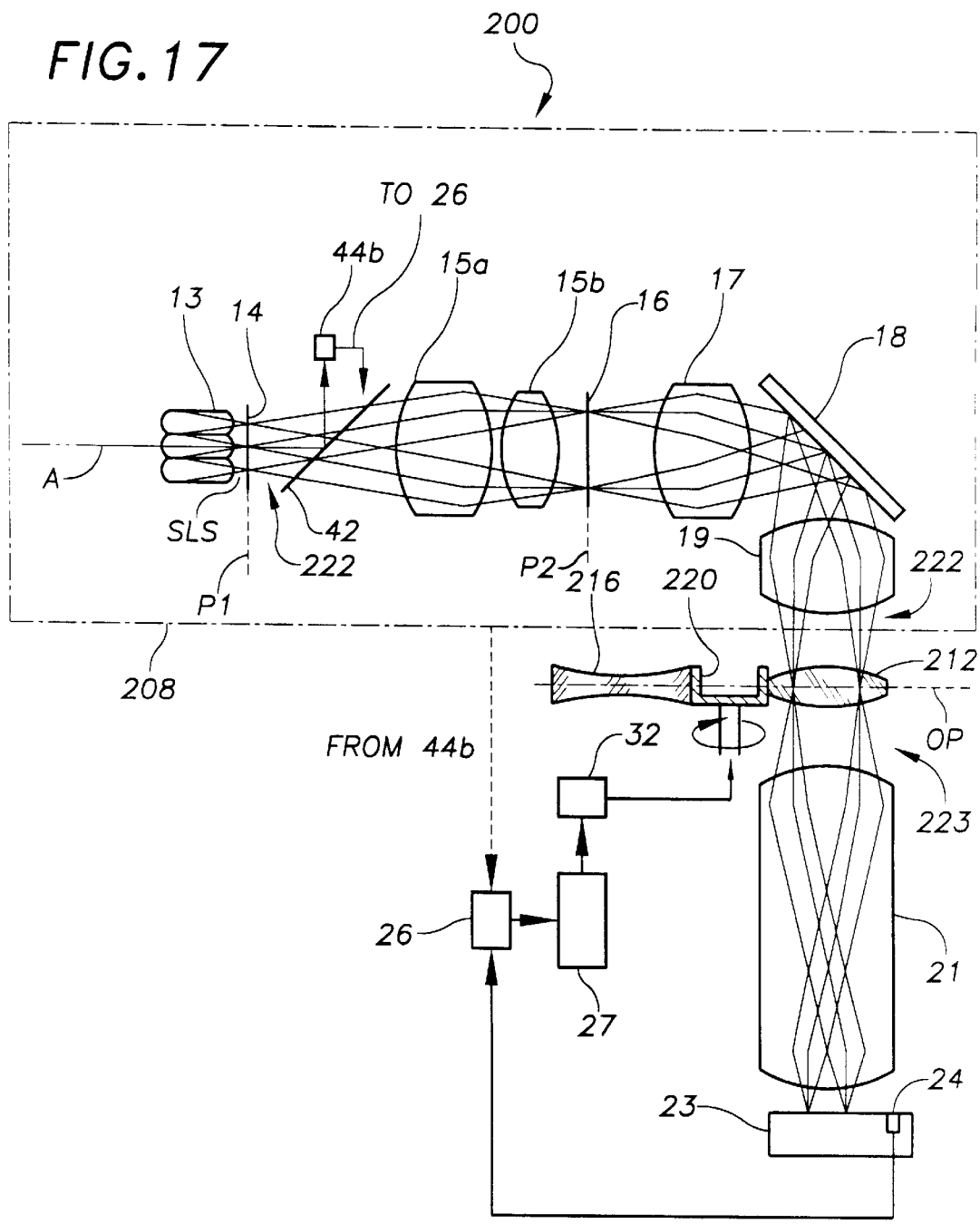
FIG. 17 is the optical exposure apparatus of FIG. 16 with the illumination optical apparatus shown in greater detail.

With reference now to FIG. 17, the elements 13–19 comprising illumination optical system 208 (i.e., the brokenline box) of optical exposure apparatus 200 are the same elements 13–19 as described above in connection with optical exposure apparatus 5 of FIG. 1. Light beam 222 emanating from second objective lens 19 irradiates photo-cleaning optical member 212, for example, arranged at object plane OP.

Figure 18:
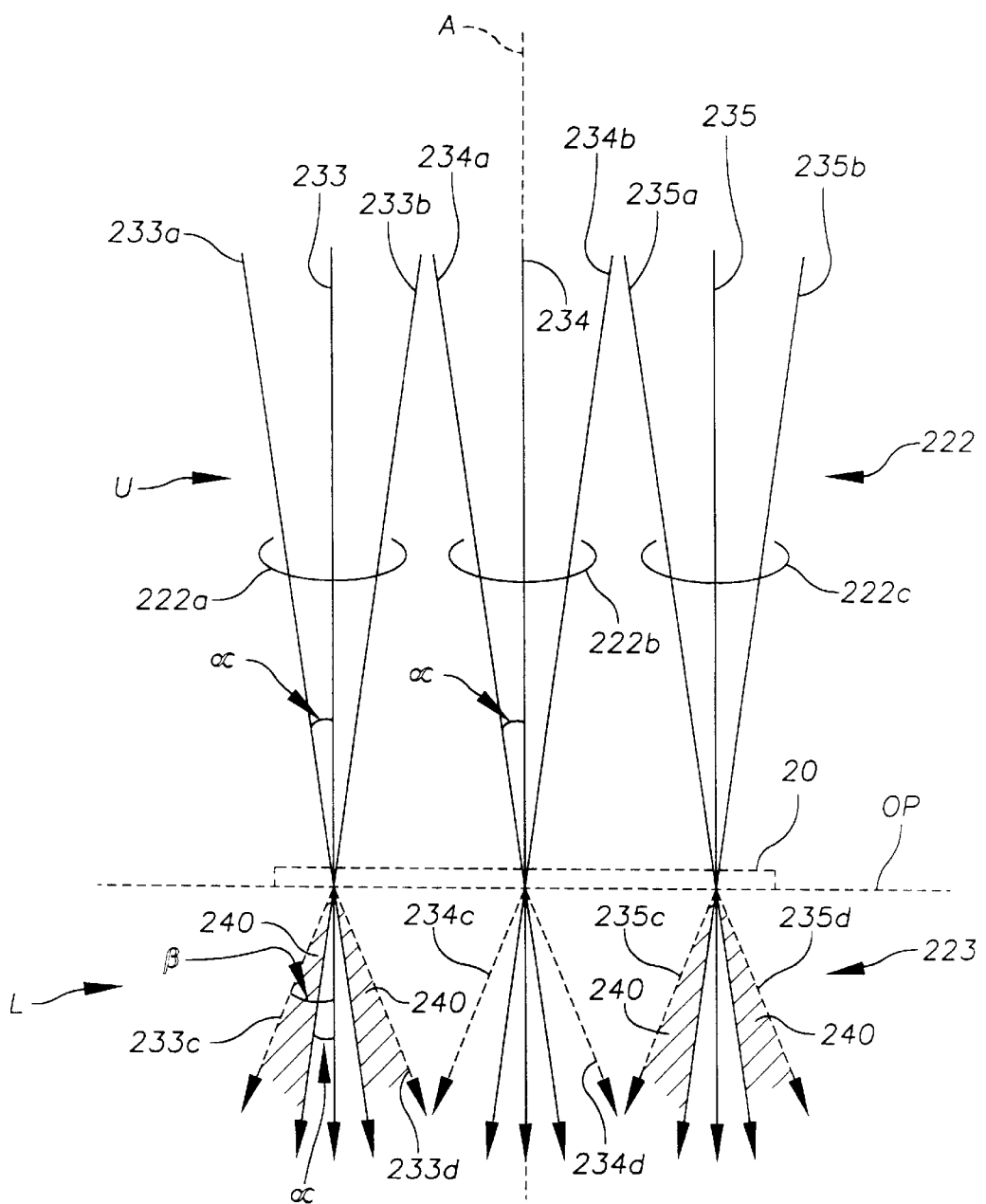
FIG. 18 illustrates the path of the exposure light beams from the illumination optical apparatus before and after passing through a mask arranged at the object plane.

The function of photo-cleaning optical members 212 and 216 is now explained. To facilitate this explanation, photo-cleaning will be explained for the case where no photo-cleaning optical member is used. With reference now to FIG. 18, light beam 222 from illumination optical system 208 is "upstream" of object plane OP and light beam 223 is "downstream" of object plane OP. The illumination optical system side of object plane OP is the "upper part" U or "upstream" region, and the "lower part" L is the projection lens side or "downstream" region. Light beam 222 comprises light beams 222a–222c, which include principal light rays 233, 234, and 235, respectively. Principal light rays 233, 234 and 235 pass through the left-most, center (i.e, axial) and right-most side of the drawing within the exposure range on object plane OP (i.e., within the outline of mask 20). In addition, rays 233a and 233b of light beam 222a impinge object plane OP at an angle α with respect to principal ray 233. Likewise, rays 234a and 234b of light beam 222b impinge object plane OP at an angle α with respect to principal ray 234, and rays 235a and 235b of light beam 222c impinge at angle a with respect to principal ray 235. Here, the angle α is related to the illumination optical system 208 numerical aperture by the relation $NA_I = n \cdot \sin \alpha$, where n in the present case is the refractive index of air (n=1).

Figure 19:
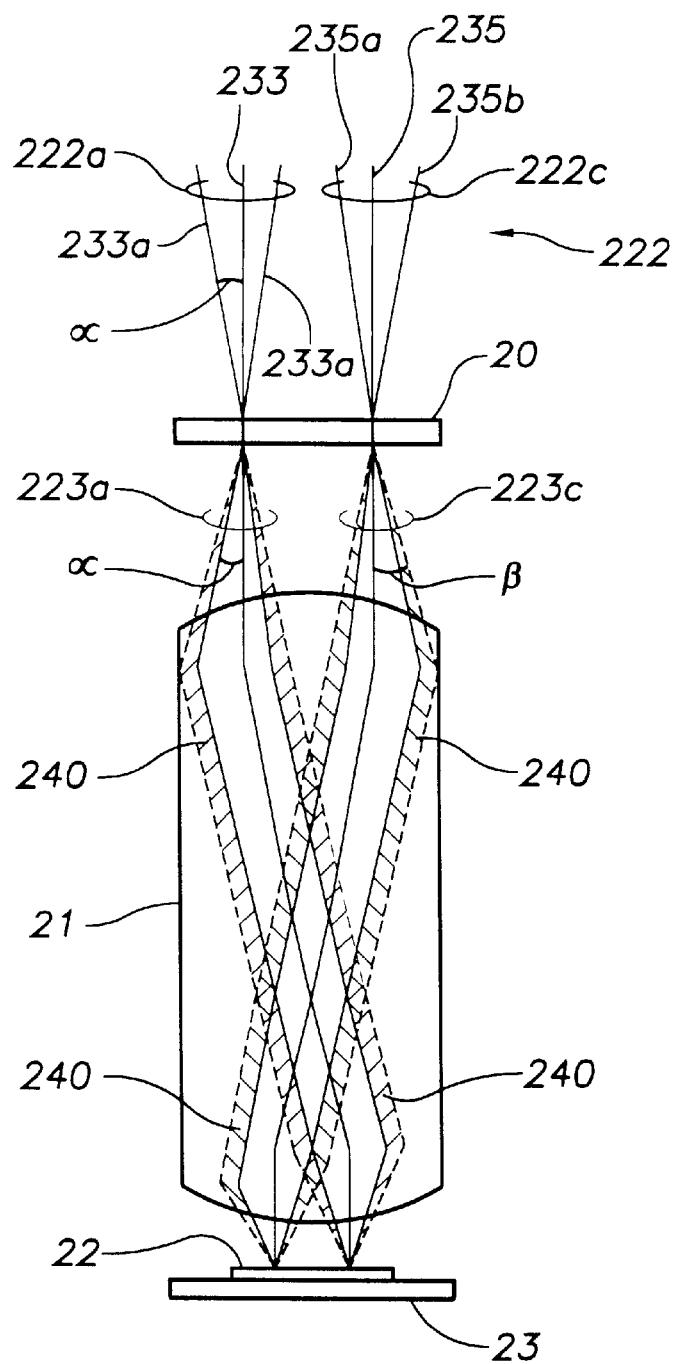
FIG. 19 illustrates the path of the exposure light beams from the illumination optical apparatus before and after passing through a mask arranged at the object plane, and then passing through the projection lens to the workpiece.

With continuing reference to FIG. 18, if mask 20 is arranged at object plane OP, light beams 222a–222c are diffracted by the mask. A portion of the diffracted light, as depicted by light rays 233c, 233d, 234c, 234d, 235c and 235d, is generated wherein the angle β of these rays, as measured from their corresponding principal rays, is larger than angle α. Angle β is the half-angle associated with the numerical aperture $NA_P$ of projection lens 21 on the object (mask 20) side. With reference now to FIG. 19, among the diffracted light rays generated by mask 20, only the light rays having an angle with respect to optical axis A less than angle β can pass through projection lens 21 and form an image on workpiece 22 arranged on workpiece stage 23.

With continuing reference to FIGS. 18 and 19, if no mask 20 is present at object plane OP, light beam 222 on upper side U (i.e., on the projection lens side) has an angle a the same as on lower side L (i.e., on the illumination optical system side), as shown by the solid line rays. Consequently, if photo-cleaning of the lens surfaces comprising projection lens 21 is performed with the exposure light without mask 20 present in object plane OP, then the exposure light does not irradiate the lens surfaces that include angular regions 240 (shaded). Consequently, the portions of the lenses corresponding to angular regions 240 are not photo-cleaned.

Figure 20:
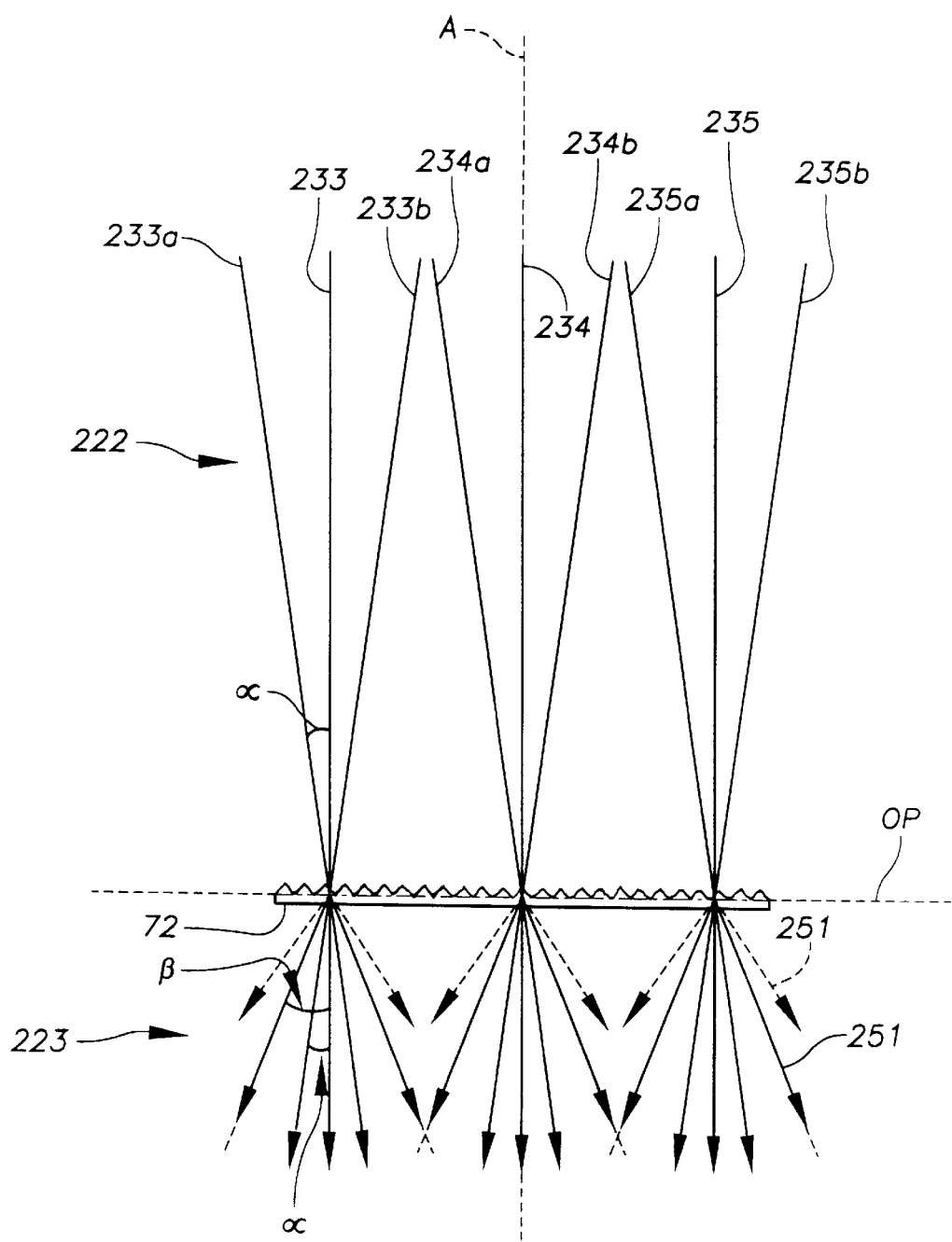
FIG. 20 illustrates the path of the exposure light beams from the illumination optical apparatus before and after passing through a photo-cleaning optical member comprising a diffusion plate.

With reference now to FIG. 20, to solve this shortcoming, a method involving diffusing the illumination light (i.e., light beam 222) by a diffusion plate, such as discussed above in connection with diffusion plate 72 of apparatus 70 of FIG. 7, and proposed in Japanese Patent Application No. Hei 9-155856, is one possible option. If diffusion plate 72 is used, diffused light rays 251 having an angle greater than angle α is obtained, and only those diffused light rays having an angle less than angle β pass through projection lens system 21. As a result, the lens surfaces in the region greater than angle α and less than angle β can also be photo-cleaned.

In contrast, the present invention is constituted so that the lens surfaces of projection lens 21 in the region greater than angle α and less than angle β are photo-cleaned by refracting light beam 222 by a photo-cleaning optical member (for example, a convex lens or concave lens and the like) having refractive power.

Figure 21:
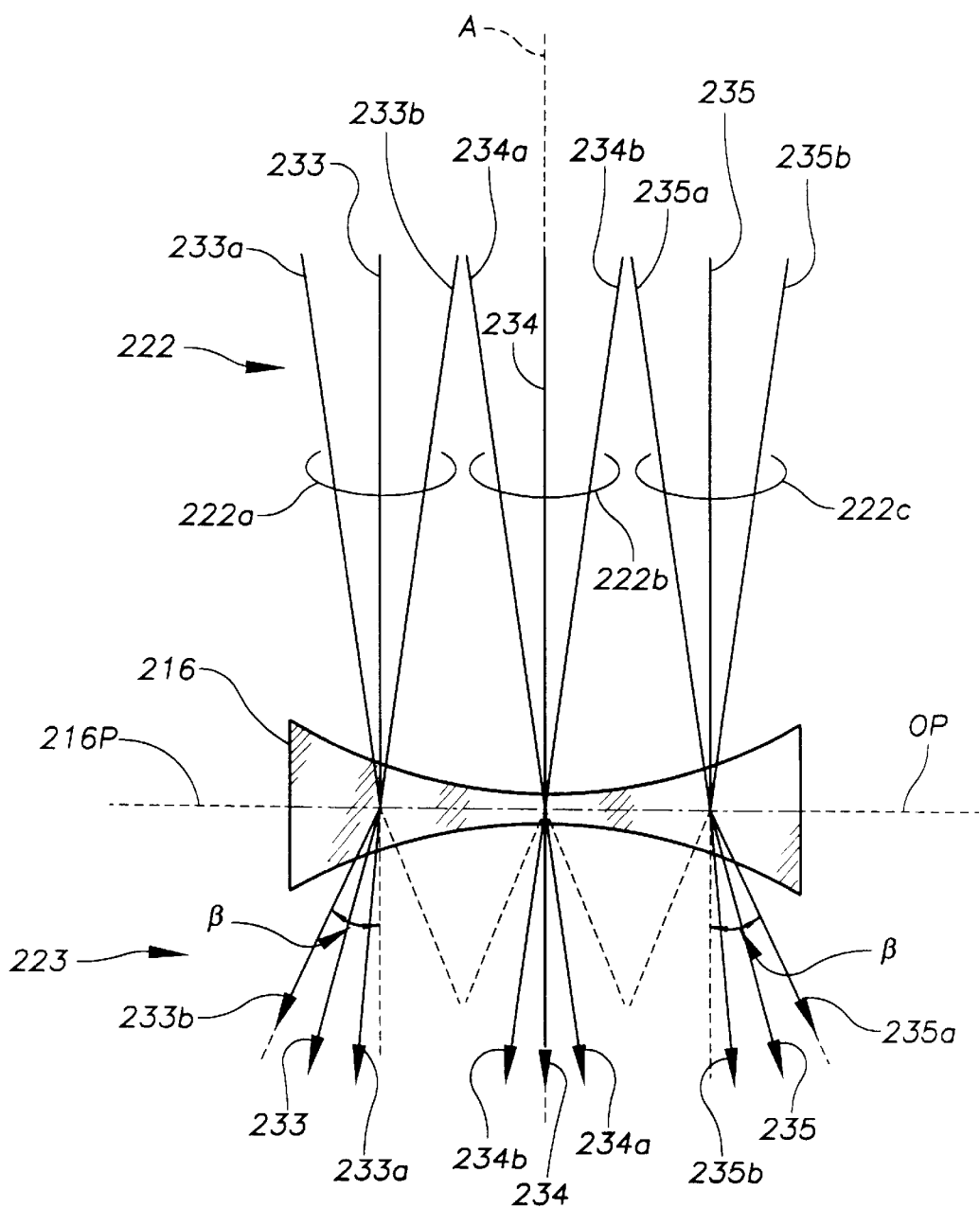
FIG. 21 illustrates the path of the exposure light beams from the illumination optical apparatus before and after passing through a photo-cleaning optical member comprising a negative lens having negative refractive power.

With reference now to FIG. 21, a negative lens (hereinafter referred to as a concave lens) 216 with a principle plane 216P and having negative refractive power is used as a photo-cleaning optical member. Photo-cleaning is achieved refracting each light beam 222a–222c in light beam 222, with photo-cleaning concave lens 216. The latter is arranged such that principal plane 216P coincides with object plane OP, and the central axis (not shown) of the concave lens coincides with optical axis A. Principle rays 233 and 235 are refracted by concave lens 216 such that they become more distant from optical axis A. The refractive power (focal length) of concave lens 216 is set such that rays 233b and 235a, which form an angle α with respect to optical axis A before refraction, form an angle equal to angle β after refraction. The method for setting the focal length of concave lens 216 is discussed in further detail below.

Figure 22:
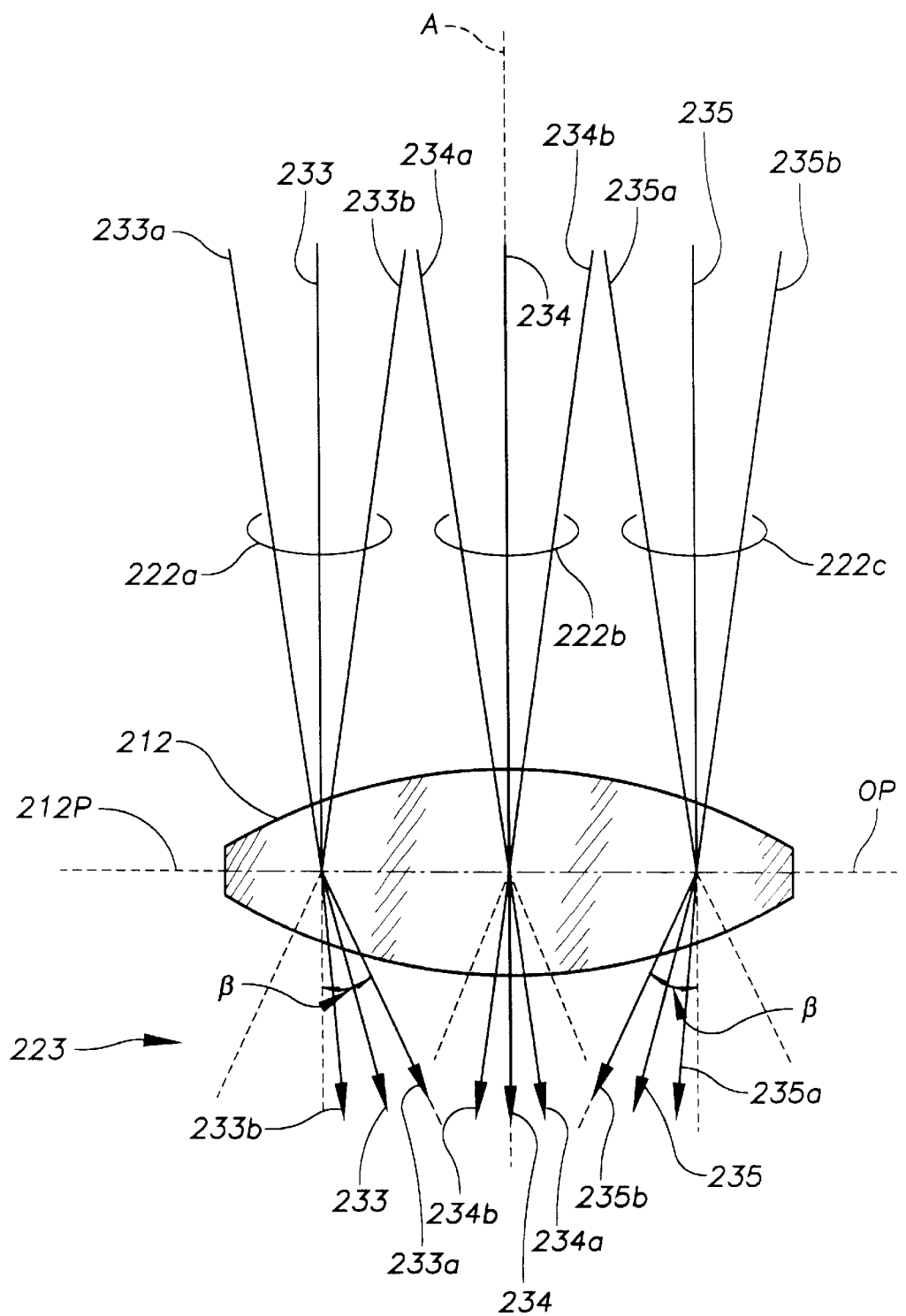
FIG. 22 illustrates the path of the exposure light beams from the illumination optical apparatus before and after passing through a photo-cleaning optical member comprising a positive lens having positive refractive power.

With reference now to FIG. 22, a positive lens (hereinafter referred to as a convex lens) 212 with a principle 212P and having positive refractive power is used as a photo-cleaning optical member. Photo-cleaning is achieved by refracting each light beam 222a–222c in light beam 222 with photo-cleaning convex lens 212. The latter is arranged such that principal plane 212P coincides with object plane OP and the central axis (not shown) of the convex lens coincides with optical axis A. Principle rays 233 and 235 are refracted by convex lens 212 such that they approach optical axis A. The refractive power (focal length) of convex lens 212 is set such that the angles of rays 233a and 235b with respect to optical axis A become, after refraction, nearly equal to angle β. Furthermore, the angular change Θ of rays 233a and 235b before and after refraction is expressed as:

$$\Theta = \beta - \alpha = \sin^{-1}(NA_P) - \sin^{-1}(NA_I)$$

Next, with reference to FIGS. 23a and 23b, the method of setting focal length f of concave lens 216 and convex lens 212 is explained. FIG. 23a shows the case for concave lens 216, and 23b shows the case for convex lens 212. Principal rays 233 and 235 refract at nearly angle Θ if angular change Θ arises as with rays 233b–235a in FIG. 21 and rays 233a–235b in FIG. 22. Thus, the following sets the focal length with the angle of refraction as Θ. In FIGS. 23a and 23b, F is the focal point of the lens in question. For concave lens 216, $F_{216}$ is the point of intersection when principal rays 233 and 235 after refraction, are extended toward upper side U (i.e., the upper portion of FIG. 23a). For convex lens 212, $F_{212}$ is the point where principal rays 233 and 235, after refraction, intersect on lower side L (i.e., the lower portion of the FIG. 23b). Focal length $f_0$ is given by the equation $$|f_0| = d/\tan \Theta = d/[\tan\{\sin^{-1}(NA_P)\} - \tan\{\sin^{-1}(NA_I)\}]$$

wherein d is the distance of principal rays 233 and 235 from optical axis A, as measured at object plane OP. In the case of concave lens 212, which is a negative lens, focal length $f_0$ is less than 0.

The magnitude |f| of focal length f of the photo-cleaning optical member should be set to less than $|f_0|$, as defined in the above equation.

Figure 24A:
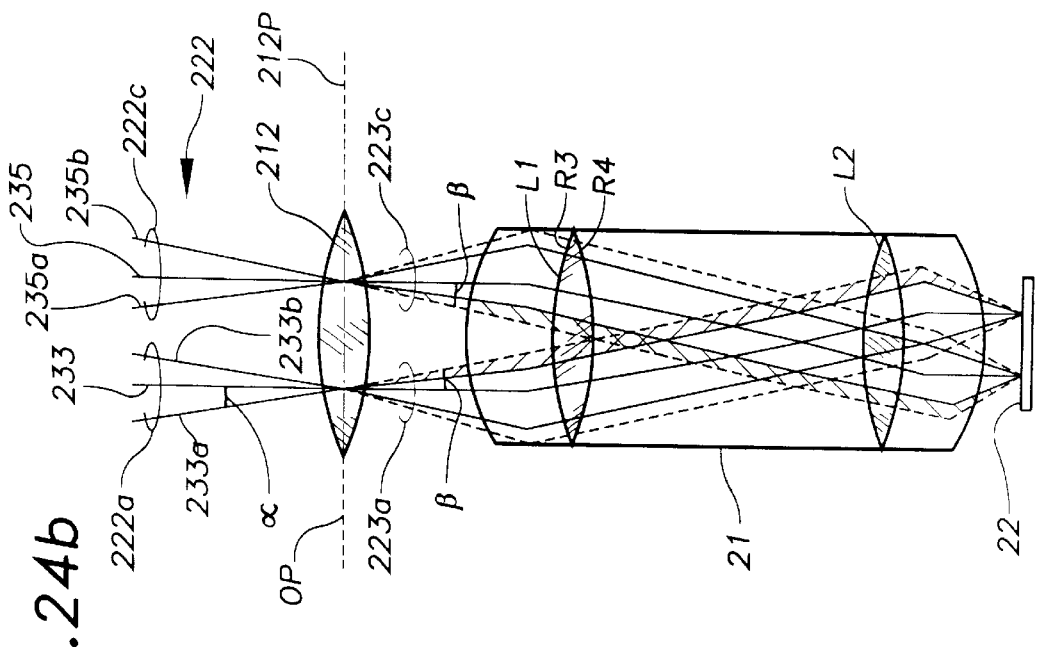
FIGS. 24a and 24b illustrate the path of the exposure light beams from the illumination optical apparatus before and after passing through a photo-cleaning optical member comprising a negative lens (FIG. 24a) and a positive lens (FIG. 24b), and then through the projection lens.
Figure 24B:
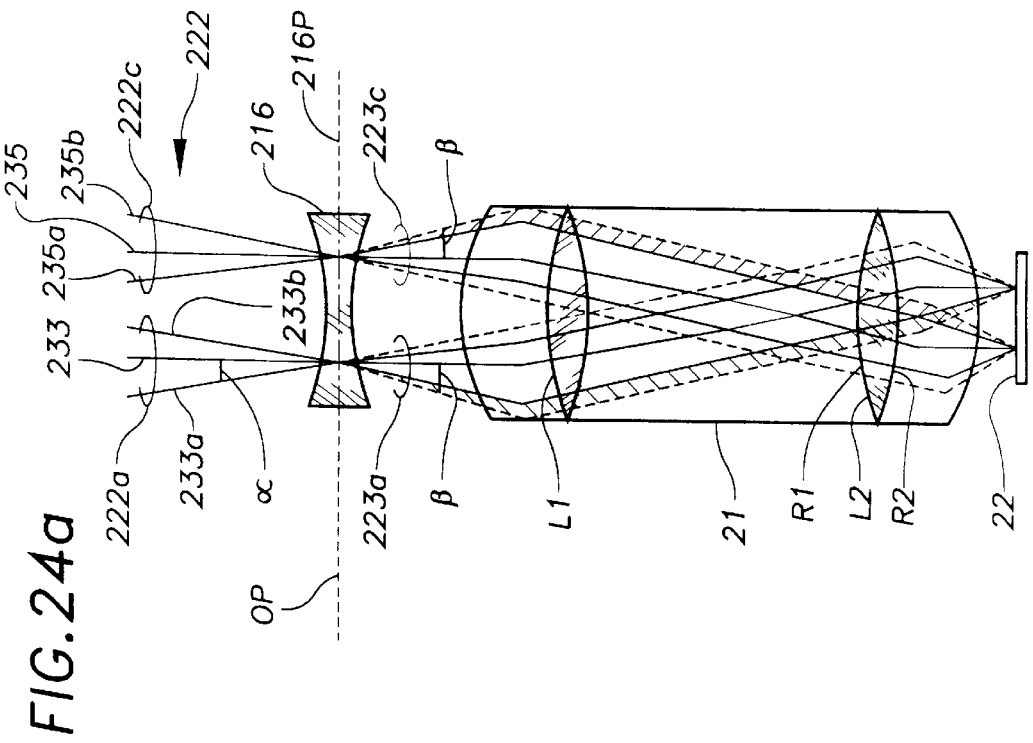

FIGS. 24a and 24b show light beams 222a and 222c (i.e., the light beams associated with principal rays 233 and 235) refracted by concave lens 216 (FIG. 24a) and by convex lens 212 (FIG. 24b), with $f=f_0$, to form light beams 223a and 223c. The latter then pass through projection lens 21, and form an image on photosensitive workpiece 22. In FIGS. 16, 17, and 19, projection lens 21 is shown as a single lens, but one skilled in the art will appreciated that the projection lens typically comprises a plurality of lenses.

With continuing reference to FIGS. 24a and 24b, the case where lenses L1 and L2 comprising projection lens 21 and provided at the positions shown therein is now considered. Regions R1 and R2 in lens L2 shown in FIG. 24a are regions through which the exposure light passes during exposure of the mask (not shown). However, it can be seen that regions R1 and R2 are not irradiated by the exposure light if concave lens 216 is used as the photo-cleaning optical member. Consequently, if concave lens 216 is used as the photo-cleaning optical member, regions R1 and R2 on the lens surfaces of lens L2 cannot be photo-cleaned.

On the other hand, with reference to FIG. 24b, if convex lens 212 is used as the photo-cleaning optical member, the regions R3 and R4 on the surfaces of lens LI are not irradiated by the photo-cleaning exposure light. Accordingly, the lens surfaces at regions R3 and R4 cannot be photo-cleaned.

With reference now to both FIGS. 24a and 24b, it can be seen that the regions R1 and R2 of lens L2 can be photo-cleaned if convex lens 212 is used, and the regions R3 and R4 of lens L1 can be photo-cleaned if concave lens 212 is used. In this manner, there is a risk that a lens surface will arise that cannot be photo-cleaned by the exposure light with just one of concave lens 216 and convex lens 212 by virtue of the lens configuration of projection lens 21. Accordingly, it is preferable to perform photo-cleaning alternately using both concave lens 216 and convex lens 212.

With reference again to FIG. 17, there is a possibility of contamination of lens surfaces immediately after manufacturing the optical exposure apparatus (e.g., optical exposure apparatus 200), when replacing the mask, if the optical exposure apparatus has not been used for a long period of time, or due to maintenance of the optical exposure apparatus and the like. In these cases, photo-cleaning is performed by arranging, before starting the exposure process, the abovementioned cleaning optical members 216 and 212, at object plane OP, and performing the photo-cleaning operation. At this point, the transmittance of projection lens 21 is measured by detectors 44b and 24. If the transmittance of projection lens 21 due to light irradiation from several minutes to several hours reaches a level that does not significantly change, then the photo-cleaning optical member (e.g., concave lens 216 or convex lens 212) is withdrawn from object plane OP. A process mask is then arranged at object plane OP, a photosensitive workpiece 22 is arranged on workpiece stage 23, and the exposure process is started (see FIG. 19). In the mode for carrying out the present invention, as discussed above, one of photo-cleaning optical members 216 and 212 is provided at object plane OP. However, the photo-cleaning elements need not be so arranged. For instance, they may be provided on the projection lens side of aperture stop 16, which determines the numerical aperture of illumination optical system 208. Aperture stop 16 may, in turn, be located between projection lens 21 and light source 10.

Photo-cleaning Procedure

A specific method for photo-cleaning according to the present invention is now explained. Generally, reductions in the transmittance of projection lens can be broadly classified as being either of two cases:
(1) a drop in the transmittance of the lens elements themselves, and
(2) the adherence of contaminants to the lens surfaces.

In case (1), the transmittance of the entire projection lens can drop as far as approximately 80%. However, in this case, only a drop in the illumination intensity on the photosensitive substrate occurs, and illumination uniformity (i.e., evenness) does not deteriorate. In case (2) as well, the same reduction in overall illumination intensity as in case (1) arises if the extent of contamination is light. However, if the extent of contamination is heavy, then this is no longer true. For example, if air directly contacts the lenses immediately after manufacturing of the apparatus or due to maintenance of the optical system and the like, then the transmittance can drop as far as approximately 10% in the worst case, as compared to the case of a lens having no contamination at all. Further, deterioration of illumination uniformity arises on the photosensitive substrate due to transmittance non-uniformity.

As discussed above, if the contamination becomes heavy and the illumination uniformity deteriorates, it is necessary to perform photo-cleaning uniformly over the entire lens surface. On the other hand, in case (1), or in case (2) with small amounts of contamination, it is possible to correct the change in transmittance by controlling the exposure light quantity, as discussed below. Furthermore, when measuring the illumination uniformity, the exposure light quantity (i.e., intensity) at each location in the exposure region (i.e., image field) is measured using detector 24 (see FIG. 16). The difference between the maximum value and the minimum value of the exposure light quantity at that time is calculated, and the illumination uniformity is judged to assess whether it has deteriorated. Photo-cleaning is performed when this difference (i.e., the non-uniformity) exceeds a specified value.

Explanation of Exposure Based on Exposure Light Quantity Control

FIG. 25 shows a graph 280 representing a time-varying characteristic of the transmittance of projection lens 21 when laser light is irradiated thereon and in which transmittance has uniformly dropped. The transmittance drops greatly immediately after the start of irradiation of laser light ("START EXPOSURE"), but rises gradually thereafter and nearly reaches the saturation state with the elapse of a certain amount of time, as explained in greater detail below. The extent of the transmission drop immediately after the start of laser irradiation depends on changes in the internal characteristics of the glass comprising the lenses. The phenomenon of gradual recovery thereafter is due to the removal, by laser light irradiation, of contaminants (water and organic substances) adhering to the lens surfaces.

In the present mode for carrying out the photo-cleaning method of the present invention, the time varying transmittance characteristic represented by graph 280 is pre-stored in storage unit 230 (FIG. 16). Occasionally, the exposure operation is interrupted due to, for example, the replacement operation of a photosensitive substrate (e.g., workpiece 22), or if optical exposure apparatus 200 is stopped for a long period of time (e.g., on the order of ten hours). In this case, the transmittance of projection lens 21 is first measured using detectors 44b and 24 prior to restarting the exposure operation. With continuing reference to FIG. 25 and graph 280, if the transmittance prior to restarting exposure is given as $T_A$, it is assumed that the transmittance changes as time proceeds in the right direction along the horizontal time axis from $t_0$ when the exposure is restarted (starting time $t_0$). Furthermore, the exposure light quantity from light source 10 is adjusted, based on the time-varying transmittance characteristic stored in storage unit 230, such that the illumination intensity on the photosensitive substrate is maintained at the appropriate level. Thereafter, operation shifts to normal exposure without controlling the exposure light quantity if the change in transmittance becomes small (i.e., the time lapsed is $t_1$, and the transmittance is $T_B$).

With reference now to FIG. 26, flowchart 300 outlines the procedure for exposure and controlling the exposure light quantity, discussed above, and for photo-cleaning after manufacturing the optical exposure apparatus, after maintenance, or other interruptions. Flow chart 300 also shows the procedure from the "start" (Step S0) to the "end" (Step S6) of the exposure operation.

First, step S1 determines whether the optical exposure apparatus is in a state immediately after assembly (i.e., immediately after it is manufactured), or after maintenance. If immediately after assembly or maintenance, the flow proceeds to step 2, photo-cleaning, as discussed in greater detail below. Otherwise, it proceeds to step S11, also discussed below. Assuming having proceeded to photo-cleaning step S2, the flow proceeds next to step S3 in which normal exposure is performed without exposure light quantity control. Step S4 then inquires whether the exposure is interrupted. If the answer to this query is YES, then the flow proceeds to step S11. If not interrupted, the flow proceeds to step S5, which inquires whether the exposure has ended. If the query in step S5 is answered YES, the exposure procedure ends at step S6. If the query in step S5 is answered NO, the flow returns to step S3 and normal exposure is performed.

On the other hand, if the flow proceeds from step S1 to step S11, then step S11 inquires whether the transmittance is lower than $T_B$ of graph 280, i.e., whether the exposure light quantity corresponds to the necessary transmittance. If the answer to this query is YES, the flow proceeds to step S12. If the answer to this query is NO, then the flow proceeds to step S3, and normal exposure is performed. Step S12 inquires whether the illumination uniformity on the photosensitive substrate (i.e., workpiece 22) has exceeded a specified (predetermined) value and deteriorated. If so, the flow proceeds to step S2, and photo-cleaning is performed. If there is no deterioration in the illumination uniformity, the flow proceeds to step S13, and exposure is performed while controlling the exposure light quantity. Step S14 inquires whether the exposure time has reached or exceeded a predetermined time ($t_1-t_0$), namely whether the change in transmittance has become sufficiently small and greater than or equal to $T_B$. If the answer to this query is YES, the flow proceeds to step S3, and exposure is performed under normal exposure starting from the next exposure. On the other hand, if the answer to this query is NO, the flow returns to step S11.

Figure 27:
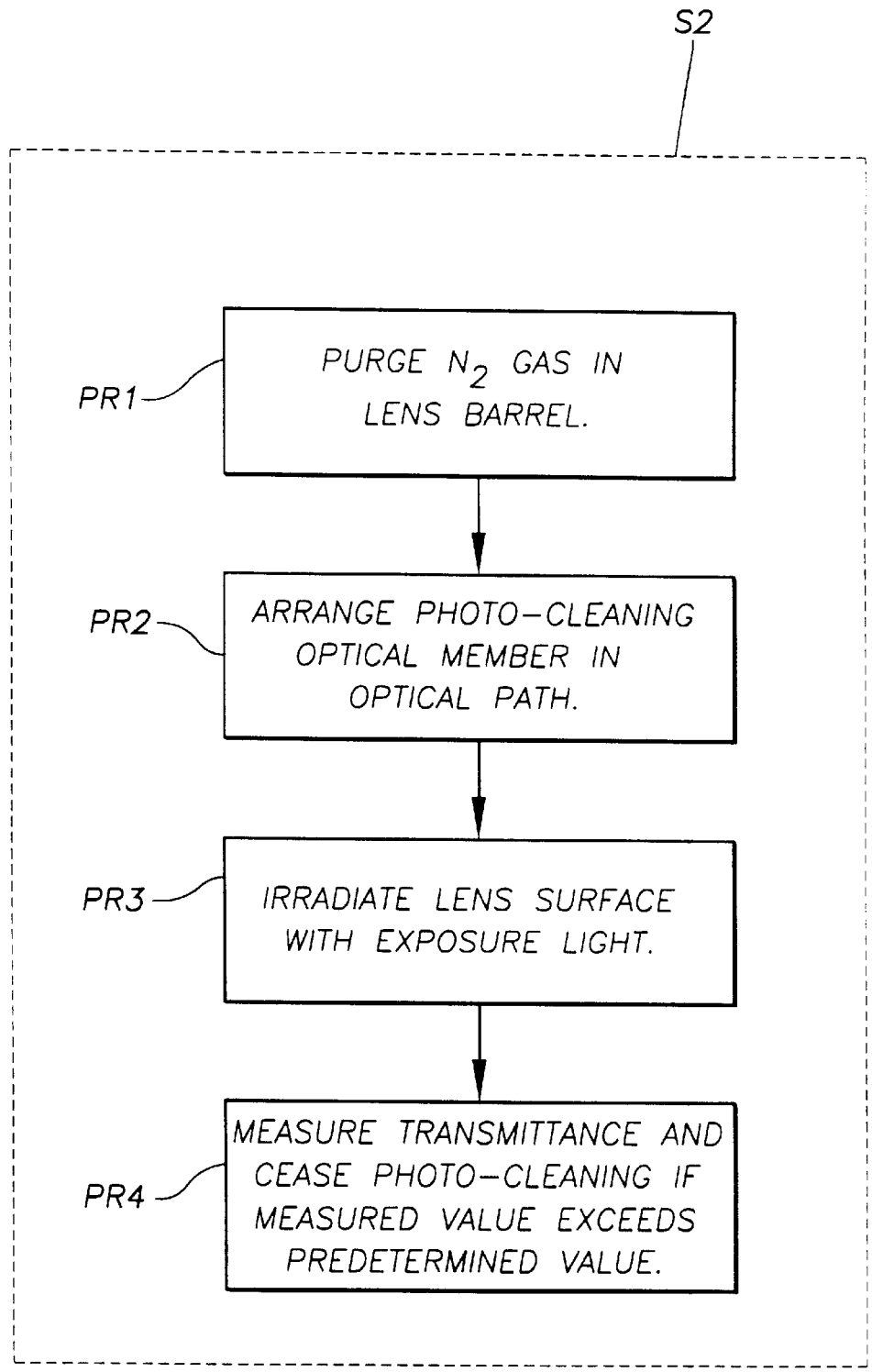
FIG. 27 is a flow chart of the specific photo-cleaning procedure of Step 2 of the flow chart of FIG. 26.

With reference now to FIG. 27, a specific procedure for photo-cleaning performed in step S2 of flow chart 280 is explained. Process PR1 purges N2 gas (nitrogen gas) through projection lens 21, i.e., between the lenses in the lens barrels therein, immediately after manufacturing the optical exposure apparatus or after maintenance thereof. In the next process PR2, if concave lens photo-cleaning optical member 216 (see FIG. 16) is arranged at object plane OP in the optical path, photo-cleaning is performed by irradiating the lens surfaces of projection lens 21 with the exposure light in process PR3. In this case, after arranging concave lens photo-cleaning optical member 216 at object plane OP, convex lens photo-cleaning optical member 212 is arranged at the object plane and photo-cleaning is performed by irradiating the lens surfaces of projection lens 21 with the exposure light. Next, in process PR4, the transmittance of projection lens 21 is measured using detectors 44b and 24. Photo-cleaning is completed if the measured transmittance reaches or exceeds a predetermined value (e.g., $T_B$ in graph 280). In addition, if the transmittance is smaller than predetermined value $T_B$, photo-cleaning is performed until the transmittance reaches or exceeds predetermined value $T_B$.

The present mode for carrying out the invention, as discussed above, can illuminate the entire numerical aperture $NA_P$ region of projection lens 21 by refracting the illumination light (i.e., exposure light), using photo-cleaning optical members concave lens 216 or convex lens 212. As a result, the contaminants adhering to the lens surfaces within the numerical aperture $NA_P$ region can be eliminated by photo-cleaning with the exposure light. In addition, in the present mode for carrying out the invention, the entire numerical aperture $NA_P$ region is illuminated by refracting light beam 222 (see FIG. 16). Thus, more effective photo-cleaning can be performed without any reduction in the quantity of light, such as occurs in the method wherein illumination light is diffused using a diffusion plate, as discussed earlier.

It will be understood by one skilled in the art that the above-described embodiment of the invention using concave lens 216 and convex lens 212, is not so limited. For example, any optical member having a positive or negative refractive power can be used. In addition, a reflecting optical member (e.g., a mirror) having reflecting power may be provided on the illumination optical system side as the photo-cleaning optical member. Furthermore, in the present mode for carrying out the invention, the photo-cleaning effectiveness can be further increased by setting the numerical aperture of the illumination optical system greater than or equal to the effective diameter of the optical elements comprising projection lens 21. In addition, photo-cleaning may also be performed by providing a photo-cleaning light source separate from the exposure light source, and using the light of the photo-cleaning light source for photo-cleaning. In this case, it is preferable to use a light source that emits light of a wavelength nearly equal to the wavelength of the exposure light. In addition, in the mode for carrying out the present invention, an ArF laser was considered as a light source for generating the exposure light, for the sake of explanation. However, the present invention can also be applied to an optical exposure apparatus that uses extreme ultra-violet light (EUVL) like soft X-rays having a short wavelength.

Also, in the present invention, support apparatus 220 and drive system 32 constitute a lens-moving apparatus, light detection system (i.e., transmittance measuring apparatus) 26 constitutes a transmittance calculating means, control system 27 constitutes a controlling means, storage unit 230 constitutes a storage means, and detectors 44b and 24, and light detection system 26 constitute a detection means.

To summarize, according to the present invention as described above, moisture and organic matter and the like adhering to optical elements constituting the projection lens can be eliminated by means of photo-cleaning. This allows for a satisfactory mask pattern image to be transferred onto a photosensitive substrate. Even if the transmittance of the projection lens drops in a photolithography process that includes an exposure method, the transmittance of the projection lens can be sufficiently restored by newly adopting a photo-cleaning process. Consequently, semiconductor devices like LSIs having a higher level of integration can be manufactured, since a finer pattern can be transferred onto a photosensitive substrate. In addition, if the photo-cleaning process according to the present invention is used when manufacturing the projection lens, it becomes possible to perform assembly and maintenance of the projection lens in a normal working environment, and the transmittance of the projection lens can be sufficiently ensured.

Further, as explained above, according to the present invention, even if the numerical aperture $NA_I$ of the illumination optical system is smaller than the numerical aperture of the projection lens $NA_P$, the entire surface of the lens surface region (numerical aperture region) corresponding to the numerical aperture of the projection lens can be illuminated by refracting the light beam from the illumination optical system by a photo-cleaning optical member, without reducing the quantity of light of the light beam. As a result, contaminants adhering to the numerical aperture region of the lens surface can be more effectively eliminated.

In particular, according to one embodiment of the present invention, the photo-cleaning optical member comprises one of a positive lens and a negative lens, and the positive lens and negative lens can be selectively used in accordance with the lens configuration of the projection lens. Consequently, the entire numerical aperture region of the lens surfaces of the projection lens can be photo-cleaned, regardless of the lens configuration of the projection lens. In addition, since the mask and photo-cleaning optical member(s) are supported by the support apparatus and are selectively arranged at the object plane, the time required for photo-cleaning can be shortened. Also, since exposure is performed while continuing to control (a) photo-cleaning or (b) the cumulative exposure light quantity in accordance with the extent of illumination uniformity, high-precision exposure can be performed.

The above-described embodiments are meant to clarify the technical details of the present invention. For instance, the optical components are described and shown in the figures as single elements, whereas in practice one skilled in the art will know that such components may include multiple elements. In addition, the above-described embodiments can be combined (e.g., the oscillating lens embodiment can be employed in optical exposure apparatus 5 with certain obvious modifications) to create other optical exposure apparatuses with photo-cleaning capability. Thus, since certain changes may be made to the apparatuses and methods disclosed herein with respect to the to the aforementioned preferred embodiments without departing from the scope of the invention, it is intended that all matter contained in the above description and shown in the accompanying drawings be interpreted in an illustrative and not in a limiting sense.

What is claimed is:

1. A method for manufacturing a projection optical system, comprising the steps of:
    assembling the projection optical system so as to form a pattern onto a photosensitive substrate; and
    recovering from a decrease of light intensity caused by said projection optical system, wherein the step of recovering comprises separating at least one contaminant that is adhered to at least one surface of at least one optical element of the projection optical system from the at least one surface and the step of recovering is performed at a time when the projection optical system is not being used to expose a workpiece to light.

2. A method according to claim 1, wherein the step of recovering from a decrease of light intensity comprises the step of illuminating said projection optical system with light having a wavelength less than 200 nanometers.

3. A method according to claim 1, further comprising the step of supplying a predetermined gas to at least a portion of said projection optical system.

4. A method according to claim 3, further comprising the step of discharging the predetermined gas from said at least a portion of said projection optical system.

5. A method according to claim 3, wherein the predetermined gas includes inert gas.

6. A method according to claim 3, further comprising the step of measuring the light intensity with respect to light passed through said projection optical system.

7. A method according to claim 6, further comprising the step of adjusting said projection optical system.

8. A method according to claim 1, further comprising the step of measuring light intensity with respect to light passed through said projection optical system before the step of recovering from a decrease of light intensity.

9. A method according to claim 8, further comprising the step of adjusting said projection optical system.

10. A method according to claim 1, further comprising the step of adjusting said projection optical system after the step of recovering from a decrease of light intensity.

11. A method for manufacturing a projection optical system, comprising the steps of:
    assembling said projection optical system so as to form a pattern onto a photosensitive substrate; and
    eliminating a contamination of at least one optical element of said projection optical system, wherein the step of eliminating comprises separating at least one contaminant that is adhered to at least one surface of the at least one optical element of the projection optical system from the at least one surface and the step of eliminating is performed at a time when the projection optical system is not being used to expose a workpiece to light.

12. A method according to claim 11, wherein the step of eliminating a contamination comprises the step of illuminating said projection optical system with light having a wavelength less than 200 nanometers.

13. A method according to claim 11, further comprising the step of supplying a predetermined gas to at least a portion of said projection optical system.

14. A method according to claim 13, further comprising the step of discharging the predetermined gas from said at least a portion of said projection optical system.

15. A method according to claim 13, wherein the predetermined gas includes inert gas.

16. A method according to claim 13, further comprising the step of measuring the light intensity with respect to light passed through said projection optical system.

17. A method according to claim 16, further comprising the step of adjusting said projection optical system.

18. A method according to claim 11, further comprising the step of measuring light intensity with respect to light passed through said projection optical system before the step of eliminating a contamination.

19. A method according to claim 18, further comprising the step of adjusting said projection optical system.

20. A method according to claim 11, further comprising the step of adjusting said projection optical system after the step of eliminating a contamination.

21. A method for manufacturing an optical system, comprising the steps of:
    assembling said optical system;
    supplying a predetermined gas to at least a portion of said optical system; and
    recovering from a decrease of light intensity caused by said optical system, wherein the step of recovering comprises separating at least one contaminant that is adhered to at least one surface of at least one optical element of the optical system from the at least one surface and the step of recovering is performed at a time when the optical system is not being used to expose a workpiece to light.

22. A method according to claim 21, further comprising the step of adjusting said optical system.

23. A method according to claim 21, further comprising the step of measuring the light intensity with respect to light passed through said optical system.

24. A method according to claim 21, wherein the predetermined gas includes inert gas.

25. A method according to claim 21, further comprising the step of discharging the predetermined gas from said at least a portion of said optical system.

26. A method for manufacturing an optical system, comprising the steps of:

assembling said optical system;

supplying a predetermined gas to at least a portion of said optical system; and eliminating a contamination of at least one optical elements of said optical system, wherein the step of eliminating comprises separating at least one contaminant that is adhered to at least one surface of the at least one optical element of the optical system from the at least one optical element and the step of eliminating is performed at a time when the optical system is not being used to expose a workpiece to light.

27. A method according to claim 26, further comprising the step of adjusting said optical system.

28. A method according to claim 26, further comprising the step of measuring the light intensity with respect to light passed through said optical system.

29. A method according to claim 26, wherein the predetermined gas includes inert gas.

30. A method according to claim 26, further comprising the step of discharging the predetermined gas from said at least a portion of said optical system.

31. A method for manufacturing a semiconductor device, comprising the steps of:

illuminating a reticle; and transferring a pattern of said reticle onto a photosensitive substrate by using the projection optical system manufactured by the method according to claim 7.

32. A method for manufacturing a semiconductor device, comprising the steps of:

illuminating a reticle; and transferring a pattern of said reticle onto a photosensitive substrate by using the projection optical system manufactured by the method according to claim 9.

33. A method for manufacturing a semiconductor device, comprising the steps of:

illuminating a reticle; and transferring a pattern of said reticle onto a photosensitive substrate by using the projection optical system manufactured by the method according to claim 1.

34. A method for manufacturing a semiconductor device, comprising the steps of:

illuminating a reticle; and transferring a pattern of said reticle onto a photosensitive substrate by using the projection optical system manufactured by the method according to claim 17.

35. A method for manufacturing a semiconductor device, comprising the steps of:

illuminating a reticle; and transferring a pattern of said reticle onto a photosensitive substrate by using the projection optical system manufactured by the method according to claim 19.

36. A method for manufacturing a semiconductor device, comprising the steps of:

illuminating a reticle; and transferring a pattern of said reticle onto a photosensitive substrate by using the projection optical system manufactured by the method according to claim 11.

37. A method for manufacturing a semiconductor device, comprising the steps of:

illuminating a reticle; and transferring a pattern of said reticle onto a photosensitive substrate by using the optical system manufactured by the method according to claim 21.

38. A method for manufacturing a semiconductor device, comprising the steps of:

illuminating a reticle; and transferring a pattern of said reticle onto a photosensitive substrate by using the optical system manufactured by the method according to claim 26.

39. A method for manufacturing a projection optical system according to claim 1, wherein the at least one contaminant is separated from the at least one surface of the optical element by photo-cleaning the at least one surface of the at least one optical element.

40. A method for manufacturing a projection optical system according to claim 11, wherein the at least one contaminant is separated from the at least one surface of the optical element by photo-cleaning the at least one surface of the at least one optical element.

41. A method for manufacturing an optical system according to claim 21, wherein the at least one contaminant is separated from the at least one surface of the optical element by photo-cleaning the at least one surface of the at least one optical element.

42. A method for manufacturing an optical system according to claim 26, wherein the at least one contaminant is separated from the at least one surface of the optical element by photo-cleaning the at least one surface of the at least one optical element.

* * * * *